(12) United States Patent
Gopal et al.

(10) Patent No.: US 11,258,459 B2
(45) Date of Patent: Feb. 22, 2022

(54) METHODS AND APPARATUS TO PARALLELIZE DATA DECOMPRESSION

(71) Applicant: Intel Corporation, Santa Clara, CA (US)

(72) Inventors: Vinodh Gopal, Westborough, MA (US); James D. Guilford, Northborough, MA (US); Sudhir K. Satpathy, Hillsboro, OR (US); Sanu K. Mathew, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/996,012

(22) Filed: Aug. 18, 2020

(65) Prior Publication Data

US 2021/0211139 A1 Jul. 8, 2021

Related U.S. Application Data

(63) Continuation of application No. 16/402,845, filed on May 3, 2019, now Pat. No. 10,763,894, which is a
(Continued)

(51) Int. Cl.
*H03M 7/00* (2006.01)
*H03M 7/30* (2006.01)
*H03M 7/40* (2006.01)

(52) U.S. Cl.
CPC .......... *H03M 7/3086* (2013.01); *H03M 7/40* (2013.01); *H03M 7/4037* (2013.01); *H03M 7/6005* (2013.01); *H03M 7/6023* (2013.01)

(58) Field of Classification Search
CPC ...... H03M 9/00; H03M 7/4031; H03M 7/425; H03M 7/40; H03M 7/4018; H03M 7/42;
(Continued)

(56) References Cited

U.S. PATENT DOCUMENTS

| 4,008,460 A | 2/1977 | Bryant et al. |
| 4,688,108 A | 8/1987 | Cotton et al. |

(Continued)

FOREIGN PATENT DOCUMENTS

| EP | 2346255 | 7/2011 |
| JP | 2008099134 | 4/2008 |

OTHER PUBLICATIONS

Collet, "LZ4 Explained, RealTime Data Compression," Development blog on compression algorithms, May 26, 2011, 15 pages.
(Continued)

*Primary Examiner* — Jean B Jeanglaude
(74) *Attorney, Agent, or Firm* — Hanley, Flight & Zimmerman, LLC

(57) ABSTRACT

Methods and apparatus to parallelize data decompression are disclosed. An example method selecting initial starting positions in a compressed data bitstream; adjusting a first one of the initial starting positions to determine a first adjusted starting position by decoding the bitstream starting at a training position in the bitstream, the decoding including traversing the bitstream from the training position as though first data located at the training position is a valid token; outputting first decoded data generated by decoding a first segment of the bitstream starting from the first adjusted starting position; and merging the first decoded data with second decoded data generated by decoding a second segment of the bitstream, the decoding of the second segment starting from a second position in the bitstream and being performed in parallel with the decoding of the first segment, and the second segment preceding the first segment in the bitstream.

20 Claims, 12 Drawing Sheets

Related U.S. Application Data continuation of application No. 15/875,836, filed on Jan. 19, 2018, now Pat. No. 10,320,414, which is a continuation of application No. 15/335,705, filed on Oct. 27, 2016, now Pat. No. 9,876,509, which is a continuation of application No. 14/850,721, filed on Sep. 10, 2015, now Pat. No. 9,484,954.

(58) Field of Classification Search
CPC ............ H03M 7/3086; H03M 7/6005; H03M 7/6023; H03M 7/4037
USPC ..................................................... 341/50, 51
See application file for complete search history.

(56) References Cited

U.S. PATENT DOCUMENTS

| | | | |
|---|---|---|---|
| 5,325,092 A | | 6/1994 | Allen et al. |
| 5,406,279 A * | | 4/1995 | Anderson ........... H03M 7/3086 341/51 |
| 5,829,007 A | | 10/1998 | Wise et al. |
| 5,949,356 A | | 9/1999 | Kim et al. |
| 5,969,650 A | | 10/1999 | Wilson |
| 6,414,608 B1 | | 7/2002 | Nishida et al. |
| 6,573,846 B1 | | 6/2003 | Trivedi et al. |
| 6,587,057 B2 | | 7/2003 | Scheuermann |
| 6,822,589 B1 | | 11/2004 | Dye et al. |
| 6,865,668 B1 | | 3/2005 | Beneš et al. |
| 6,879,266 B1 * | | 4/2005 | Dye ........................ G06F 12/08 341/51 |
| 7,660,352 B2 * | | 2/2010 | Yamane ................. H04N 19/68 375/240.12 |
| 9,484,954 B1 * | | 11/2016 | Gopal ................. H03M 7/3086 |
| 9,876,509 B2 * | | 1/2018 | Gopal ................. H03M 7/4037 |
| 10,320,414 B2 | | 6/2019 | Gopal et al. |
| 10,763,894 B2 | | 9/2020 | Gopal et al. |
| 2009/0172495 A1 | | 7/2009 | Wang et al. |
| 2010/0254620 A1 | | 10/2010 | Iwahaski et al. |
| 2014/0286417 A1 | | 9/2014 | Gamei et al. |
| 2017/0141790 A1 * | | 5/2017 | Gopal ................. H03M 7/6023 |
| 2018/0375527 A1 * | | 12/2018 | Gopal ..................... H03M 7/40 |
| 2019/0273507 A1 * | | 9/2019 | Cassetti ............. H03M 7/6023 |

OTHER PUBLICATIONS

International Searching Authority, "International Search Report and Written Opinion," mailed in connection with International Patent Application No. PCT/US2016/046049, dated Nov. 14, 2016, 13 pages.

United States Parent and Trademark Office, "Notice of Allowance," mailed in connection with U.S. Appl. No. 14/850,721, dated Jul. 7, 2016, 7 pages.

United States Patent and Trademark Office, "Non-final Office Action," mailed in connection with U.S. Appl. No. 15/335,705, dated Apr. 13, 2017, 6 pages.

United States Patent and Trademark Office, "Notice of Allowance," mailed in connection with U.S. Appl. No. 15/335,705, dated Sep. 7, 2017, 13 pages.

United States Patent and Trademark Office, "Ex Parte Quayle Action," mailed in connection with U.S. Appl. No. 15/875,836, dated Oct. 15, 2018, 8 pages.

United States Patent and Trademark Office, "Notice of Allowance." mailed in connection with U.S. Appl. No. 15/875,836, dated Jan. 29, 2019, 5 pages.

United States Patent and Trademark Office, "Ex Parte Quayle Action," mailed in connection with U.S. Appl. No. 14/850,721, dated Mar. 15, 2016, 6 pages.

United States Patent and Trademark Office, "Final Rejection," mailed in connection with U.S. Appl. No. 16/402,845, dated Jan. 14, 2020, 6 pages.

United States Patent and Trademark Office, "Non-final Office Action," mailed in connection with U.S. Appl. No. 16/402,845, dated Oct. 3, 2019, 6 pages.

United States Patent and Trademark Office, "Notice of Allowance," mailed in connection with U.S. Appl. No. 16/402,845, dated Apr. 22, 2020, 5 pages.

\* cited by examiner

METHODS AND APPARATUS TO PARALLELIZE DATA DECOMPRESSION

CROSS-REFERENCE TO RELATED APPLICATIONS

This patent arises from a continuation of U.S. patent application Ser. No. 16/402,845, filed May 3, 2019, entitled "METHODS AND APPARATUS TO PARALLELIZE DATA DECOMPRESSION," which is a continuation of U.S. patent application Ser. No. 15/875,836, filed Jan. 19, 2018, entitled "METHODS AND APPARATUS TO PARALLELIZE DATA DECOMPRESSION," now U.S. Pat. No. 10,320,414, which is a continuation of U.S. patent application Ser. No. 15/335,705, filed Oct. 27, 2016, entitled "METHODS AND APPARATUS TO PARALLELIZE DATA DECOMPRESSION," now U.S. Pat. No. 9,876,509, which is a continuation of U.S. patent application Ser. No. 14/850,721, filed Sep. 10, 2015, entitled "METHODS AND APPARATUS TO PARALLELIZE DATA DECOMPRESSION," now U.S. Pat. No. 9,484,954. The contents of these applications are hereby incorporated herein by reference in their entireties.

FIELD OF THE DISCLOSURE

This disclosure relates generally to data compression, and, more particularly, to methods and apparatus to parallelize data decompression.

BACKGROUND

Data decompression refers to the conversion of the compressed data bitstream to the original bitstream (or, in the case of partial decompression such as in multi-layer or multi-technique compression, a partially compressed version of the bitstream). Lossless data compression refers to a technique by which a data bitstream can be stored in a compressed bitstream consisting of fewer bits than the original bitstream. Importantly, the original data bitstream can be perfectly recovered from the compressed data bitstream.

BRIEF DESCRIPTION OF THE DRAWINGS

The figures are not to scale. Wherever appropriate, the same reference numbers will be used throughout the drawing(s) and accompanying written description to refer to the same or like parts.

DETAILED DESCRIPTION

Figure 1:
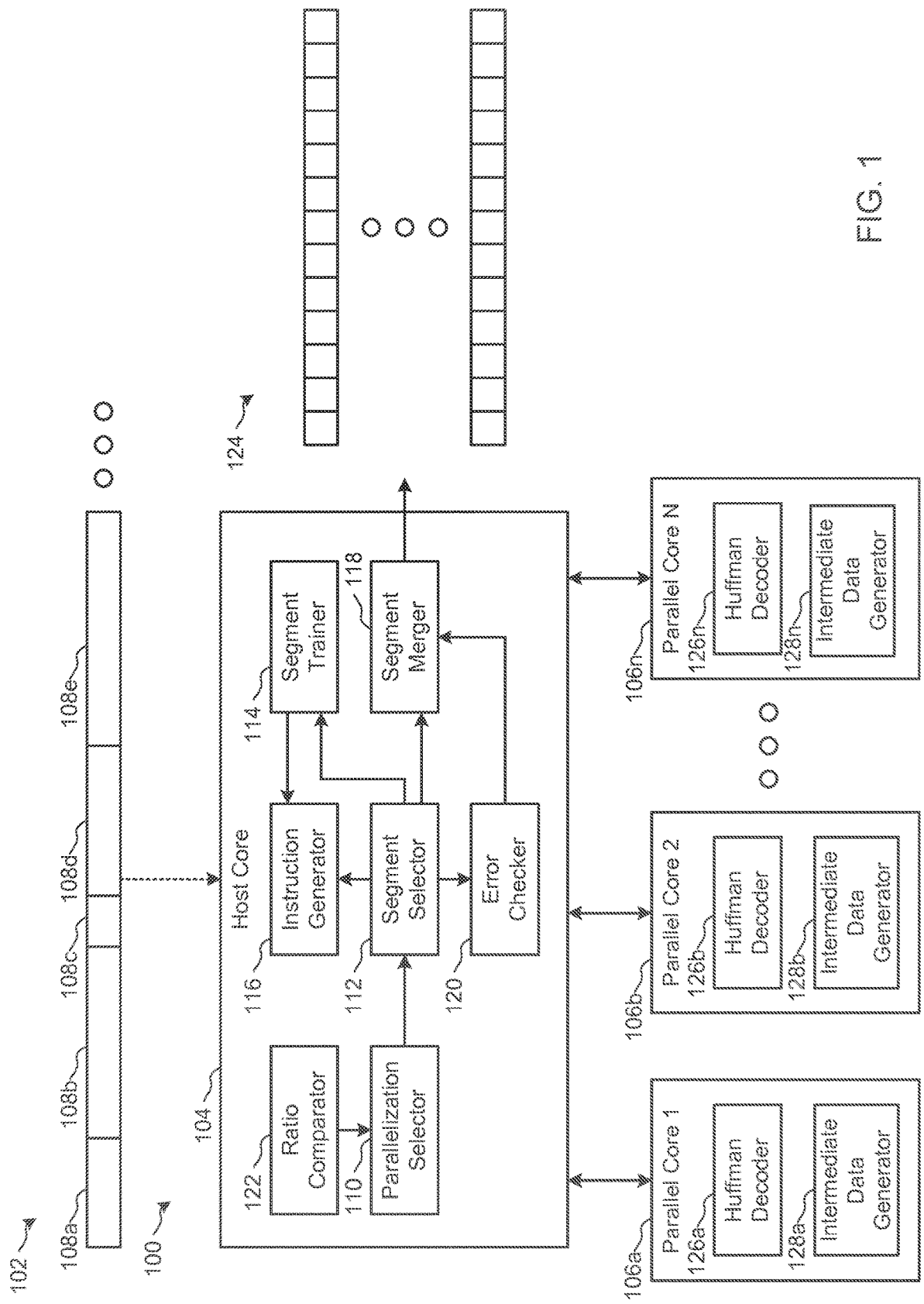
FIG. 1 is a block diagram of an example computing device to perform parallel decompression of a compressed data file.

In some applications, decompression times are important to system performance and user experience. Disclosed examples reduce the time required to perform decompression of a compressed data file. Some disclosed examples refer to widely used algorithms that belong to a family called Lempel-Ziv algorithms (LZ77). Other examples refer to other decompression techniques that use Huffman encoding to perform lossless compression, such as those techniques used in Joint Picture Experts Group (JPEG) standards, Moving Picture Experts Group (MPEG), and the like.

Disclosed examples speed up software decompression implementations of compression algorithms. The DEFLATE compression/decompression technique (e.g., used in gzip, zlib, and winzip) is a lossless compression algorithm that is most widely used. However, other compression/decompression techniques have been designed, each with its own advantages in selected usages and/or applications. Other such techniques include Snappy, LZF, and Lempel-Ziv-Oberhumer (LZO).

Compressed data generated using LZ77 compression algorithms includes two types of elements: literal bytes and references to replicated strings, where a pointer is represented as a pair that defines the length of the replicated string and the distance from the current location at which the string to be replicated can be found (e.g., <length, backward distance offset>). The process of decompressing LZ77 streams has 2 phases. Phase 1 includes decoding the input stream into tokens, which are either literals (e.g., uncompressed data) or references to repeated strings. Phase 2 includes copying either the literals and/or the repeated strings to the output bitstream or file. Phase 1 is the most computationally intensive phase, especially for formats like DEFLATE. The computational cost of phase 2 can be as low as approximately 1.4 cycle/byte (depending on the intermediate representation used between phase 1 and phase 2).

Phase 2 presents additional challenges for parallelization, because LZ77-based techniques use sliding history windows. As a result, parallelization may prevent a thread from having access to the data needed to be copied for a repeated string, thereby preventing the copying of the string. Disclosed examples parallelize phase 1, which reduces the total time for performing phase 1.

The DEFLATE operation, which is a specific implementation of the LZ77 techniques, compresses raw data into a stream of literals and length+distance symbols that are subsequently Huffman encoded to achieve further compression. Each symbol (or token) is represented by a code varying in length from 1 bit-15 bits. Some of the length and distance codes require a variable number of additional bits (0-13 bits) from the payload that are concatenated with the Huffman decoded base during decompression. Hence, each compressed symbol can vary in length from 1 bit-28 bits. The variable length encoding, in combination with the serial nature of the DEFLATE algorithm, makes it difficult or impossible to decode any subsequent symbol with confidence of correctness without first processing the symbol that is the earliest in the compressed payload. This requirement of the DEFLATE algorithm results in a bottleneck in implementations of the algorithm. The bottleneck limits decompression throughput on a single block to a theoretical maximum of 1 symbol per decode-cycle, irrespective of the number of cores and specialized hardware Huffman decoders available that are available to the decoding system.

Known decompression operations are sequential processes of decoding the symbols in the compressed bit stream. The tokens can be in a highly compressed bit-stream using entropy-encoding (e.g., DEFLATE), or in simpler packing schemes such as LZF, Snappy, or LZ4. In each of these formats, each token is usually of a variable size, which makes it practically impossible to know with certainty where subsequent tokens are located without first decoding and processing the preceding tokens. The requirement for sequential decoding is the primary limit on decompression performance for decompressing large files. For example, zlib decompression costs are approximately 13 cycles/byte on an Intel® Haswell-architecture core.

Disclosed examples perform speculative decoding using three phases. The first phase is a training phase in which the data structures are set up for decoding in parallel. The training phase increases the probability and/or confidence that speculatively decoded portions are correctly decoded. The second phase is the parallel decoding of the compressed data using parallel threads. The third phase involves merging the decoded data obtained from the parallel threads. Compared to known methods of decompression, disclosed examples can achieve up to a 900% improvement in time required to decompress a single large file by using parallel processing.

Disclosed examples use speculative decompression of compressed data files to achieve high levels of parallelism (e.g., up to 16 or more parallel threads). Examples disclosed herein may be used to decompress compressed data bitstreams that use LZ77-based compression techniques, and may be implemented using software, firmware, hardware, and/or any combination of software, firmware, and/or hardware.

As mentioned above, a decoder does not know with certainty the locations of tokens in LZ77-compressed data without first decoding the prior data in the bitstream, because the token sizes are variable. Disclosed examples accomplish the training phase by attempting to lock on to valid tokens in the data, such that when a valid token is found, subsequent decoding will also be performed on valid tokens. For example, during the training phase an initial location within the compressed data bitstream is selected (e.g., as a guess). The initial location may or may not be the location of a valid token. For example, speculatively decoding at the initial location would likely decode a random set of bits as the first token, as it is unknown where the nearest token is a location containing bits in the middle of a token is likely. However, as the speculative thread decodes additional locations, the probability of locating a valid token increases.

For example, if the speculative thread attempts to decode ~20 tokens, there is more than a 90% probability of locking onto a real token at one of the attempts. Disclosed examples perform the guesses (e.g., location selections) within a training zone located prior to the data to be decoded by the thread in the bitstream such that, when a valid token is located, further decoding in the thread is also performed on valid tokens. Therefore, while any given speculation has very low probability of finding the right start of a token, the probability of getting large numbers of attempts in a row all wrong becomes smaller. For example, if the average token size is 8 bits, then the thread has a 12.5% chance of guessing right for each attempt. The probability of guessing wrong 20 consecutive times is $87.5\%^{\wedge}20=7\%$. The probability of success within 20 tries is 93%. Other formats based on LZ77 have even higher probabilities of success. After performing the parallel decoding, disclosed examples output the results to an intermediate format, from which phase 2 (e.g., copying to the output bitstream) can be performed.

The terms "symbol" and "token" are used interchangeably throughout this disclosure to refer to a unit of compressed data in a compressed bitstream. The terms "file" and "bitstream" are used interchangeably herein to refer to a sequence of data.

Turning to the figures, FIG. 1 is a block diagram of an example computing device 100 to perform parallel decompression of a compressed data file 102. The example computing device 100 of FIG. 1 includes a host core 104 and one or more parallel cores 106*a*, 106*b*, 106*n*. While three parallel cores 106*a*, 106*b*, 106*n* are shown, any number of parallel cores may be used. In some examples, the host core 104 may also function as a parallel core during the parallelized processes disclosed herein. The example host core 104 and the example parallel cores 106*a*-106*n* are referred to generically herein as "processing units." The example host core 104 and/or the parallel cores 106*a*-106*n* may be implemented using Intel® Xeon® processors, Intel® Atom® processors, Knights Landing (KNL) processors, using threads or microthreads, and/or on heterogeneous LITTLE cores and/or using any other parallelization techniques.

The example host core 104 accesses the compressed data file 102 to be decompressed, such as in response to a command from a user and/or an instruction from a calling function (where the calling function may be executed on the host core 104 or another processing unit). The example compressed data file is compressed using Huffman coding. Huffman coding is an encoding scheme that reduces the number of bits/bytes used to store information by using shorter bit representations to represent symbols (e.g., sequences of bits or bytes) that appear more frequently and using longer bit representations to represent symbols that appear less frequently. In the example of FIG. 1, the compressed data file 102 is also encoded using LZ77 encoding, which is an encoding scheme that replaces repeated strings of bits or bytes with a reference to a prior string of the same bits or bytes. The compressed data file 102 of FIG. 1 includes variable-length blocks 108a-108e (referred to interchangeably herein as "tokens" or "symbols") that result from the output of Huffman coding.

The example host core 104 includes a parallelization selector 110, a segment selector 112, a segment trainer 114, an instruction generator 116, a segment merger 118, an error checker 120, and a ratio comparator 122.

The example parallelization selector 110 of FIG. 1 selects a number N of parallel threads to decompress the compressed data file 102. In the example of FIG. 1, the parallelization selector 110 selects the number N based on a desired length of training zone for each of the segments. For example, the training zone may be selected to have between 10 and 20 symbols of training zone. Because the symbol length depends on the compression format, the total size (in bits or bytes) of the training zone can vary. The decoding work performed during the training phase is wasted work, in that the results of the training phase are not actually used for the output, so the example parallelization selector 110 limits (e.g., minimizes) the training phase while maintaining a desired probability of success during the training phase (e.g., greater than a 90% probability of success, on average).

For example, the parallelization selector 110 may select the number N based on having a training zone of ~1-2% of the segment size. With a 50 byte training zone, the parallelization selector 110 may select a segment size of at least 5 KB. Additionally or alternatively, the parallelization selector 110 may be constrained to an upper limit of parallelization (e.g., a maximum number for N based on a number of parallel cores that are available for use). Accordingly, the example parallelization selector 110 of FIG. 1 selects the number N based on a number of cores that are available for parallel processing, expected compressed file sizes, compressibility of data, and the compression format used to compress the compressed data file 102.

The example segment selector 112 divides the compressed data file 102 into N non-overlapping segments of the data, where N is the number selected by the parallelization selector 110. In the example of FIG. 1, the segment selector 112 selects the segments of the data to have approximately the same sizes (in bits or bytes), such that the segments collectively include the entire compressed data file 102 and the segments do not overlap. In some examples, the segment selector 112 divides the compressed data file 102 by N, assigns a number of bits or bytes equal to the quotient to each of the N segments, and adds a number of bits or bytes equal to the remainder of the division to the final segment. For example, the segment selector 112 may divide a 402-byte compressed bitstream into 4 segments of 100 bytes, 100 bytes, 100 bytes, and 102 bytes.

The example segment trainer 114 of FIG. 1 determines starting positions (within the sequence of the data) for the segments. The segment trainer 114 stores the starting positions of each of the segments (e.g., in an array Starts[ ] having N data elements). The first segment (e.g., the beginning of the compressed data file 102) has a starting position of 1, and the segments that are not the first segment have starting positions approximately every L bits or bytes apart, where L is the segment size.

For each of the segments other than the first segment, the example segment trainer 114 selects a training position in the sequence of the data. The training position for a segment is located prior to the starting position of the segment in the sequence of the data. For example, if the starting position of segment 2 is byte 5000 of the compressed data file 102, and the training length is 50 bytes, the training position for segment 2 is byte 4950 of the compressed data file 102.

The example segment trainer 114 adjusts the starting position of each segment, other than the first segment, by decoding the compressed data file starting at the training position for the segment. Because it is not known whether the training position is the beginning of a symbol in the compressed data file 102, it is unknown whether a subsequent symbol identified by processing the training position is a symbol. As mentioned above, making a sufficient number of guesses (e.g., random guesses, pseudorandom guesses, etc.) of locations within the compressed data stream can result in a high likelihood to result in correctly identifying a valid symbol.

To determine the starting position or an adjusted starting position of a segment, the segment trainer 114 begins decoding starting at the training position as though the training position is the start of a symbol (as mentioned above, whether this is in fact true is unknown). The symbols in the compressed data file 102 have variable lengths, so by decoding a symbol the segment trainer 114 determines the length of the symbol and, as a result, the location of the next symbol. If the training location is, in fact, the beginning of a symbol (e.g., a correct guess), then subsequent symbols processed after processing the symbol at the training location will also be correct symbols.

On the other hand, if the training location is not a symbol (e.g., an invalid symbol), the location in the compressed data file 102 that is pointed to by the invalid symbol is effectively another guess. The example segment trainer 114 continues to process the symbols as though the symbols are correct (i.e., as though the symbols are valid symbols), until the segment trainer 114 reaches a symbol that is located at or after the starting location of the segment being trained. The data between the training location (e.g., byte 4950) and the starting location for the segment (e.g., byte 5000) is referred to as the training zone for the segment. During the decoding of the tokens within the training zone, either a) the segment trainer 114 will have guessed a correct location for at least one of the processed symbols, after which all the symbols processed by the segment trainer 114 are correct symbols because valid symbols point to subsequent valid symbols, or b) the segment trainer 114 will have processed a series of incorrect guesses.

When the example segment trainer 114 decodes the entire training zone, the example segment trainer 114 determines a location of the last token in the training zone and/or a location in the compressed data file 102 to which the last decoded symbol pointed (e.g., a location of the first symbol in the segment). If the determined location is the location pointed to by the last token (e.g., after the training zone), the determined location may be the starting location of the segment as previously determined by the segment trainer 114 or may be a location occurring after the initial starting location. If the determined location is later than the initial starting location, the example segment trainer 114 stores an adjusted starting location as the starting location for the segment.

In some examples, an initial training zone size may be used to select the segments. However, after selecting the number of segments N and dividing the data into the segments, the segment selector 112 may determine that a larger training zone may be used. A larger training zone further increases the likelihood that the segment trainer 114 will identify a starting location or an adjusted starting location for a segment that corresponds to a valid symbol.

In some examples, the segment trainer 114 includes an additional constraint on the starting location for the segment, in which the segment trainer 114 selects the starting location for a segment to be a selected one or more types of token rather than any valid token. For example, the segment trainer 114 may require that the starting location correspond to a literal token or a length token, and not a distance token, because in some compression algorithms a distance token only exists as part of a reference to a repeated string and is the second token (e.g., following the length token).

The example instruction generator 116 generates instructions that may be executed by one of the parallel cores 106a-106n to decode the data in the one of the segments in parallel with decoding the data in the other segments with other ones of the parallel cores 106a-106n. The example instruction generator 116 generates the instructions such that the parallel core 106a-106n assigned to a segment begins decoding starting at the adjusted starting position corresponding to that segment.

The example instruction generator 116 generates the instructions to implement at least a portion of the decoding method for a respective segment. In some examples, the instruction generator 116 generates a stub to be executed on one of the parallel cores 106a-106n, where the instructions are identical between the parallel cores 106a-106n except for an identification of the input data (e.g., one of the segments) and an identification of the output data (e.g., a location of the decoded data corresponding to the segment).

In some examples, the instruction generator 116 may generate instructions to implement instances of the segment trainer 114, for respective ones of the segments, using the parallel cores 106a-106n. In other words, the example instruction generator 116 may parallelize the training for the segments. However, because the segment training is a relatively fast process, the segment trainer 114 may be implemented in the host core 104 as shown in FIG. 1 without incurring a significant processing time penalty (relative to parallelization of the process).

The example segment merger 118 merges the outputs of decoding the segments in parallel. For example, the decoding of the segments occurs via the parallel cores 106a-106n by executing the instructions generated by the instruction generator 116. In some examples, the segment merger 118 performs serial decoding of an intermediate data format. For example, in a compression scheme in which the data is encoded at a first level using LZ77 and at a second level using Huffman encoding, the parallel cores 106a-106n may output the results of Huffman decoding the compressed data file 102 to an intermediate data forma, and the segment merger 118 decodes and outputs the literals and/or repeated strings from the intermediate data format as a decompressed data file 124. The example segment merger 118 decodes the intermediate data format in the order of the segments in the compressed data file.

The example error checker 120 of FIG. 1 determines whether each of the segments is correctly decoded by the parallel cores 106a-106n. In some examples, the error checker 120 determines that each of the segments is correctly decoded by determining that a last decoded symbol in a segment points to the starting location of the immediately subsequent segment. In other words, the example error checker 120 may determine whether the one of the segments is correctly decoded by determining whether a final symbol in one of the segments points to a first symbol corresponding to the starting position of the next one of the segments. By determining that the starting locations are correct using the prior segments, the example error checker 120 verifies that the correct symbols were decoded for a segment (e.g., verifies that the training phase corrected locked onto the symbols for the segment). In some examples, the error checker 120 determines whether a segment is correctly decoded based on whether all of the segments preceding the segment in the compressed data file 102 have been determined to be correctly decoded.

In the example of FIG. 1, the computing device 100 improves decompression times for compressed data files that have less than a threshold compression ratio (e.g., compressed data files that are likely to have symbols lengths not exceeding or rarely exceeding a symbol length threshold). However, certain types of compressed data files that have very large symbol lengths (e.g., some data files compressed using the Snappy algorithm) may result in no improvement or even an increased file decompression time. The example ratio comparator 122 of FIG. 1 determines whether the file is compressed to less than a threshold compression ratio prior to permitting the computing device 100 to proceed with the parallel decoding.

For example, the ratio comparator 122 may determine whether the compression ratio of the compressed data file 102 is more than 80% and, if so, determines that the compressed data file 102 is likely to have relatively large blocks of uncompressed literal bytes. In file-based compression schemes, the example ratio comparator 122 can determine the compression ratio (e.g., the compressed size and/or the original stream size) from the header(s), trailer(s) and/or file statistics of the compressed data file 102. In such an example, the ratio comparator 122 invokes a serial decompression algorithm. However, different thresholds may be selected for different compression schemes.

The example ratio comparator 122 compares a compression ratio of the compressed data file 102 to a threshold (e.g., 80% compression ratio). In the example of FIG. 1, the parallelization selector to select the number N to be more than 1 when the compression ratio is less than a threshold The example parallel cores 106a-106n of FIG. 1 perform at least a partial decoding of the segments determined by the segment selector 112, using instructions generated by the instruction generator 116. In the illustrated example, the parallel cores 106a-106n perform the decoding in parallel, such that the segments are decoded simultaneously. The example parallel core 106a includes a Huffman decoder 126a and an intermediate data generator 128a. In some examples, the Huffman decoder 126a and the intermediate data generator 128a implement instructions generated by the instruction generator 116. In some other examples, the parallel core 106a is configured to include the Huffman decoder 126a and the intermediate data generator 128a in software, firmware, and/or hardware, and the parallel core 106a accepts inputs to instruct the Huffman decoder 126a and the intermediate data generator 128a rather than a set of instructions to be performed by the parallel core 106a.

The example Huffman decoder 126a of FIG. 1 performs decoding based on a Huffman coding scheme of the compressed data file 102. In some examples, the Huffman decoder 126a may possess a decoding tree used to encode the compressed data file 102, receive a decoding tree from the instruction generator 116, and/or construct the decoding tree from the compressed data file 102 (e.g., from a segment). After obtaining the decoding tree, the example Huffman decoder 126a performs Huffman decoding of the segment according to the decoding tree and based on the implementation of Huffman coding used to generate the compressed data file 102.

The example intermediate data generator 128a generates a data structure (e.g., an intermediate data structure) having an intermediate data format (e.g., a data format to store data that is partially decompressed, but not completely decompressed). The intermediate data generator 128a generates the intermediate data structure based on the decoding performed by the Huffman decoder 126a. An example intermediate data structure is the publicly available LZ4 format. A data sequence in the LZ4 format has an element for a string of literals and elements for a match (e.g., a repeated string of characters).

In some other examples, the intermediate data generator 128a uses an alternative intermediate data format, referred to herein as LZ3. The example LZ3 data format is similar to LZ4, except for the following modifications:

1) In LZ4, the size of matches is encoded as "len-4". In contrast, using the LZ3 format, the intermediate data generator 128a may either encode the length directly (e.g., "len-0"), or may support matches of no smaller than 3 bytes (e.g., "len-2").

2) The LZ4 format does not permit the encoding of two strings of literals in a row. The example intermediate data generator 128a may encode sequential strings of literals by encoding the size of the match in the intermediate data structure as "0" (e.g., to imply that there is no match).

3) LZ4 has restrictions for the last data in the encoded file (e.g., the last LZ4-encoded data sequence is only a partial one). Using LZ3, the example intermediate data generator 128a is not subject to such restrictions, and the last LZ3-encoded data sequence would be complete (e.g., the data sequence could have 0 or more literals followed by a 0 or non-zero match).

The example intermediate data generator 128a returns the intermediate data structures to the example host core 104, where the intermediate data structures are merged and/or decoded to obtain the decompressed data file 124.

In some examples, the LZ3 format includes an additional data field that stores the location(s) of the tokens that are stored in the LZ3-formatted data structure. In these examples, the location refers to the location of the token within the compressed data bitstream. For example, the data structure may include a first byte location within the compressed data file 102 at which the token for a literal stored in the intermediate data structure was identified, a second byte location within the compressed data file at which the token for a match length stored in the intermediate data structure was identified, and/or a third byte location within the compressed data file at which the token for a match distance stored in the intermediate data structure was identified. By including these location field(s) in the intermediate data structure, the correctness of individual tokens can be verified (e.g., rather than only the correctness of a segment as a whole).

As an example, when the error checker 120 identifies that one of the threads executed by one of the parallel cores 106a-106n (e.g., the parallel core 106b) has a speculation failure, at least a portion of the speculation work performed by the failed thread (e.g., the thread executed by the parallel core 106b) can be preserved. For example, rather than discarding all of the work performed by the failed thread (e.g., the thread executed by the parallel core 106b), the parallel core 106a-106n responsible for decoding the prior segment (e.g., the parallel core 106a) continues to decode into the segment of the failed thread (e.g., the thread executed by the parallel core 106b) from a corrected start position. While the parallel core 106a decodes the failed segment, the token locations in the newly-generated intermediate data structures (e.g., the intermediate data structures generated by the parallel core 106a) are compared with the token locations in the intermediate data structures generated by the failed thread (e.g., the intermediate data structures generated by the parallel core 106b). When the newly-generated intermediate data structures (e.g., the intermediate data structures generated by the parallel core 106a) have a token location that match one of the token locations of the intermediate data structures generated by the failed thread (e.g., the intermediate data structures generated by the parallel core 106b), the remainder of the intermediate data structures generated by the parallel core 106b are considered to be correctly decoded and the parallel core 106a ceases decoding of the failed segment.

The example parallel cores 106b, 106n, the example Huffman decoders 126b, 126b, and the example intermediate data generators 128b, 128n are substantially identical to the parallel core 106a, the Huffman decoder 126a, and the intermediate data generator 128a, respectively. In some examples, the parallel cores 106a-106n are additional processing cores in a same physical machine as the host core 104. In other examples, one or more of the parallel cores 106a-106n include processing resources of another physical machine, the use of which is requested by the host core 104.

Examples of decompression of a compressed data file by the example computing device 100 are described below.

While an example manner of implementing the computing device 100 is illustrated in FIG. 1, one or more of the elements, processes and/or devices illustrated in FIG. 1 may be combined, divided, re-arranged, omitted, eliminated and/or implemented in any other way. Further, the example host core 104, the example parallel cores 106a-106n, the example parallelization selector 110, the example segment selector 112, the example segment trainer 114, the example instruction generator 116, the example segment merger 118, the example error checker 120, the example ratio comparator 122, the example Huffman decoders 126a-126n, the example intermediate data generators 128a-128n and/or, more generally, the example computing device 100 of FIG. 1 may be implemented by hardware, software, firmware and/or any combination of hardware, software and/or firmware. Thus, for example, any of the example host core 104, the example parallel cores 106a-106n, the example parallelization selector 110, the example segment selector 112, the example segment trainer 114, the example instruction generator 116, the example segment merger 118, the example error checker 120, the example ratio comparator 122, the example Huffman decoders 126a-126n, the example intermediate data generators 128a-128n and/or, more generally, the example computing device 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example host core 104, the example parallel cores 106a-106n, the example parallelization selector 110, the example segment selector 112, the example segment trainer 114, the example instruction generator 116, the example segment merger 118, the example error checker 120, the example ratio comparator 122, the example Huffman decoders 126a-126n, and/or the example intermediate data generators 128a-128n is/are hereby expressly defined to include a tangible computer readable storage device or storage disk such as a memory, a digital versatile disk (DVD), a compact disk (CD), a Blu-ray disk, etc. storing the software and/or firmware. Further still, the example computing device 100 of FIG. 1 may include one or more elements, processes and/or devices in addition to, or instead of, those illustrated in FIG. 1, and/or may include more than one of any or all of the illustrated elements, processes and devices.

Flowcharts representative of example machine readable instructions for implementing the computing device 100 of FIG. 1 are shown in FIGS. 2, 3, 6, 9A-9B, 10A-10C, and 11. In this example, the machine readable instructions comprise program(s) for execution by a processor such as the processor 1212 shown in the example processor platform 1200 discussed below in connection with FIG. 12. The program(s) may be embodied in software stored on a tangible computer readable storage medium such as a CD-ROM, a floppy disk, a hard drive, a digital versatile disk (DVD), a Blu-ray disk, or a memory associated with the processor 1212, but the entire program(s) and/or parts thereof could alternatively be executed by a device other than the processor 1212 and/or embodied in firmware or dedicated hardware. Further, although the example program(s) are described with reference to the flowcharts illustrated in FIGS. 2, 3, 6, 9A-9B, 10A-10C, and 11, many other methods of implementing the example computing device 100 may alternatively be used. For example, the order of execution of the blocks may be changed, and/or some of the blocks described may be changed, eliminated, or combined.

As mentioned above, the example processes of FIGS. 2, 3, 6, 9A-9B, 10A-10C, and 11 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 2, 3, 6, 9A-9B, 10A-10C, and 11 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

Figure 2:
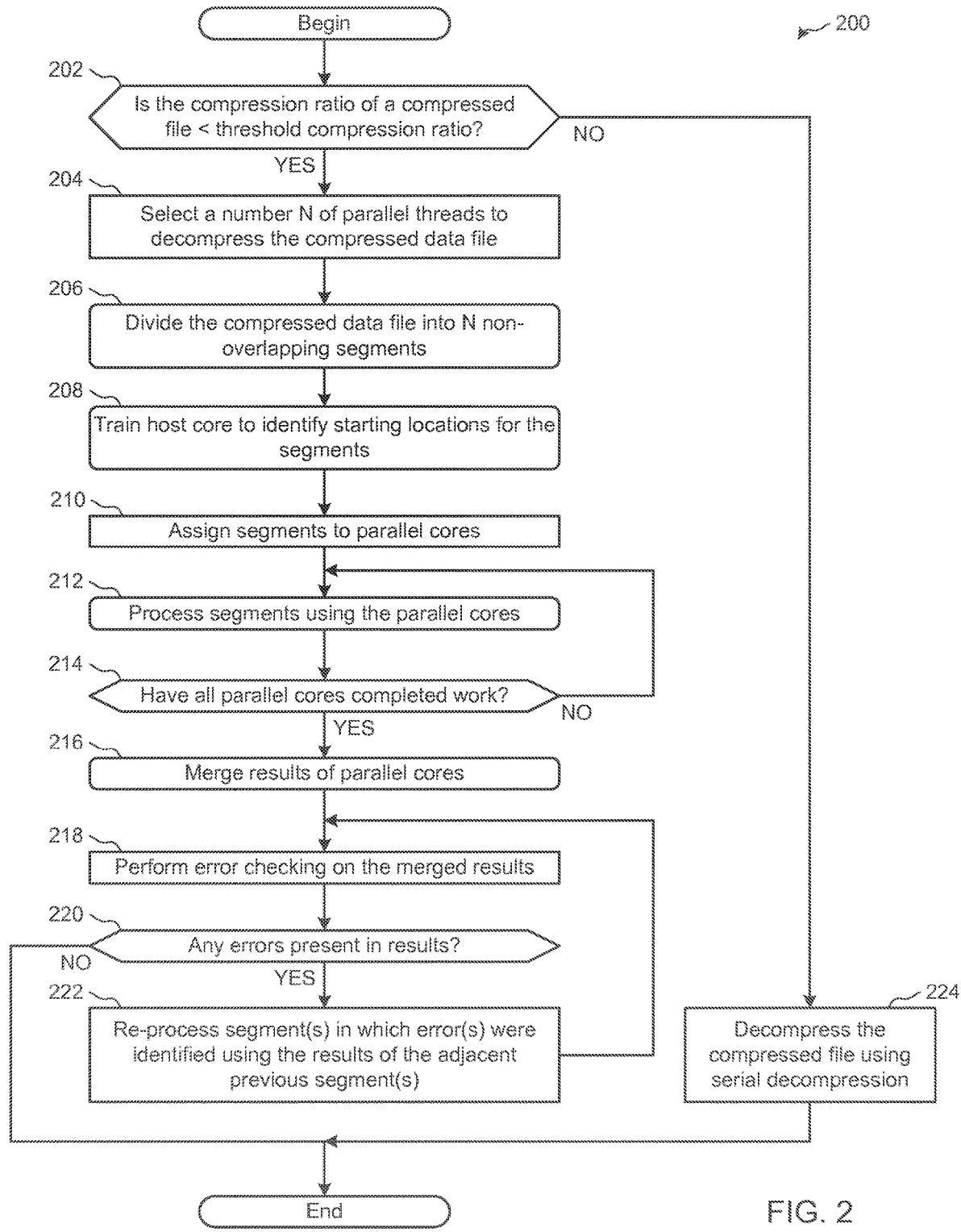
FIG. 2 is a flowchart representative of example computer readable instructions, which may be executed to implement the computing device of FIG. 1, to decompress a compressed data file by decoding portions of the compressed data file in parallel.

FIG. 2 is a flowchart representative of example computer readable instructions 200 which may be executed to implement the computing device 100 of FIG. 1 to decompress the compressed data file 102 by decoding portions of the compressed data file 102 in parallel. The example instructions 200 are described below with reference to the computing device 100 and the compressed data file 102.

The example ratio comparator 122 determines whether the compression ratio of the compressed data file 102 is less than a threshold compression ratio (block 202). For example, the ratio comparator 122 may obtain the compression ratio directly from header data in the compressed data file 102, or from compression statistics, a compressed data size, and/or a decompressed data size from header data in the compressed data file 102.

When the compression ratio of the compressed data file 102 is less than a threshold compression ratio (block 202), the ratio comparator 122 permits parallel decompression to proceed and the example parallelization selector 110 selects a number N of parallel threads to decompress the compressed data file 102 (block 204). For example, the parallelization selector 110 selects the selects the number N based on a number of cores that are available for parallel processing, expected compressed file sizes, compressibility of data, and the compression format used to compress the compressed data file 102. In some examples, the parallelization selector 110 selects the number N to be more than 2.

The example segment selector 112 divides the compressed data file into N non-overlapping segments (block 206). In some examples, the segment selector 112 divides the segments to have approximately equal sizes (e.g., to have equal sizes except for one of the segments that has a larger or smaller size than the other segments). However, any segment division scheme may be used. An example implementation of block 206 is described below with reference to FIG. 3.

The example segment trainer 114 trains the host core 104 to identify the starting location(s) for the segments (block 208). For example, the segment trainer 114 may determine a starting position for each of the segments; for each of the segments other than the first segment, select a training position in the data sequence that is prior to the starting location of the corresponding segment; and adjust the starting position for each of the segments by decoding the data starting at the training position and traversing the sequence of the data from the training position as though a symbol present in the data at the training position is a valid symbol. An example implementation of block 208 is described below with reference to FIG. 6.

The example instruction generator 116 of FIG. 1 assigns the segments to parallel cores (e.g., the parallel cores 106a-106n of FIG. 1) (block 210). For example, the instruction generator 116 may generate separate instruction sets for processing each of the segments via a separate one of the parallel cores 106a-106n.

The example parallel cores 106a-106n each process the segment assigned to the respective parallel core 106a-106n (block 212). For example, the parallel core 106a decodes the segment of the compressed data file 102 that was assigned to the parallel core 106a by the instruction generator 116, by starting decoding at the starting location for the segment. An example implementation of block 212 is described below with reference to FIGS. 9A-9B.

The example segment merger 118 determines whether all of the parallel cores 106a-106n have completed work (block 214). For example, the segment merger 118 may monitor a buffer or data structure that stores the statuses of the parallel cores 106a-106n as either complete or incomplete. If not all of the parallel cores 106a-106n have completed work (block 214), control returns to block 212 to continue processing the segments.

When all of the parallel cores 106a-106n have completed work (block 214), the example segment merger 118 merges the results of the parallel cores 106a-106n (e.g., the intermediate data structures output by the parallel cores 106a-106n) (block 216). For example, the segment merger 118 may convert the intermediate data structures from the intermediate data format (e.g., LZ4, LZ3 described above, or any other intermediate data format) to a decompressed format by outputting strings of literals and/or copying repeated strings, as indicated by the intermediate data structures. An example implementation of block 216 is described below with reference to FIG. 11.

The example error checker 120 performs error checking on the results of the merging (block 218). For example, the error checker 120 may determining whether one of segments is correctly decoded based on whether preceding segments in the sequence of the data have been correctly decoded. Additionally or alternatively, the error checker 120 may determining whether a final symbol in one of the segments points to a first symbol corresponding to the starting position of the next one of the segments.

The error checker 120 determines whether there are any errors present in the results (block 220). Errors may be present in individual segments (e.g., if the training phase for a segment did not result in locking onto a valid symbol). If there are any errors present (block 220), the example error checker 120 initiates re-processing of any segment(s) in which error(s) were identified, using the results of the adjacent previous segment(s) (block 222).

To re-process, the example error checker 120 may instruct the instruction generator 116 to generate instructions for a designated segment, using the pointer obtained from the segment prior to the designated segment. In response, the example instruction generator 116 generates instructions in a manner similar to that described with reference to block 210 above. For example, if the error checker 120 determines that segment 3 contains an error (e.g., the final symbol of segment 2 did not point to the starting location for segment 3), the example instruction generator 116 generates new instructions that cause the host core 104 or one of the parallel cores 106a-106n to process segment 3 with an updated starting location determined from the results of processing segment 2. After re-processing the segment(s) (block 222), control returns to block 218 to perform error checking.

When the compression ratio of the compressed data file is not less than the threshold compression ratio (block 202), the example ratio comparator 122 prevents parallelization of the decompression, and the computing device 100 decompresses the compressed file using serial decompression.

When there are no errors present in the results (block 220), or after decompressing the compressed file using serial decompression (block 224), the example instructions 200 of FIG. 2 may end.

Figure 3:
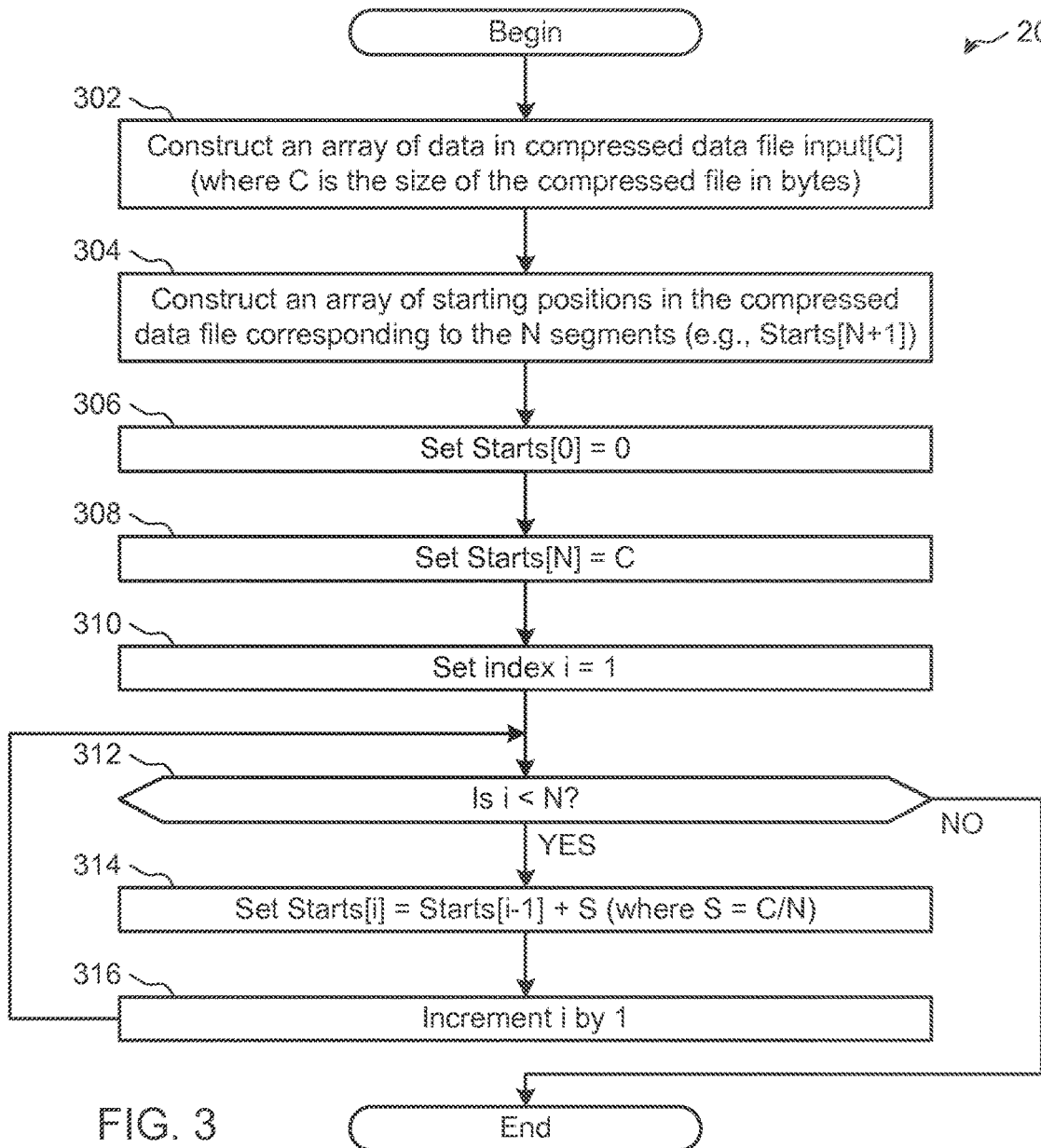
FIG. 3 is a flowchart representative of example computer readable instructions, which may be executed to implement the computing device of FIG. 1, to divide a compressed data file into segments.
Figure 4:
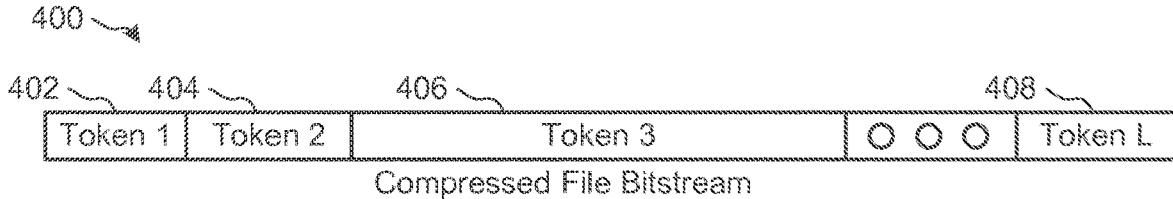
FIG. 4 illustrates an example compressed file bitstream containing multiple tokens, which may be decompressed by the example computing device of FIG. 1.
Figure 5:
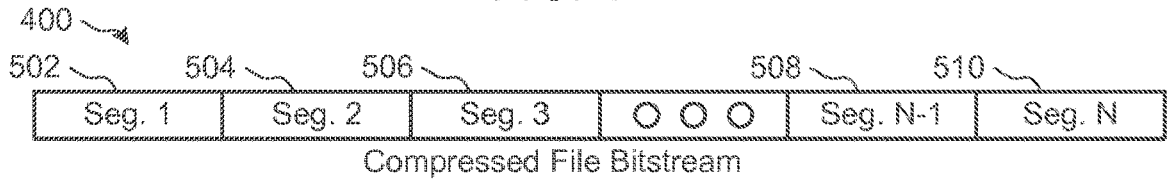
FIG. 5 illustrates the example compressed file bitstream of FIG. 4 after being divided into N segments corresponding to N-parallelization.

FIG. 3 is a flowchart representative of example computer readable instructions 206 which may be executed to implement the computing device 100 of FIG. 1 to divide a compressed data file into segments. FIG. 4 illustrates an example compressed file bitstream 400 containing multiple tokens 402-408, which may be decompressed by the example computing device 100 of FIG. 1. FIG. 5 illustrates the example compressed file bitstream 400 of FIG. 4 after being divided into N segments 502-510 corresponding to N-parallelization. FIGS. 4 and 5 are not illustrated to scale, and the each of the segments 502-510 would typically include multiple tokens (e.g., 10-20 tokens or more). The example instructions 206 of FIG. 3 may be executed to implement block 206 of FIG. 2, and are described below with reference to the computing device 100 of FIG. 1, and the example compressed file bitstream 400, the tokens 402-408, and the segments 502-510 of FIGS. 4 and 5.

The example segment selector 112 of FIG. 1 constructs an array that includes the data in the compressed file bitstream (block 302). In the example of FIG. 3, the array is referred to as inputs[C], where C is the size of the compressed file bitstream 400 in bytes. Thus, each element in inputs[ ] is one byte of the compressed file bitstream 400. The tokens 402-408 may be one or more bytes. In other examples, the inputs[ ] array may operate on bits or any other data unit size.

The example segment selector 112 constructs an array of N+1 starting positions in the compressed file bitstream 400 (block 304). The example of FIG. 3, the array is referred to as Starts[ ], where N is the number of segments selected by the parallelization selector 110 of FIG. 1.

The segment selector 112 sets the first element of Starts[ ] (i.e., Starts[ ]) to be the location of the first byte of the compressed file bitstream 400 (e.g., location 0) (block 306). The segment selector also sets the last element of Starts[ ] (i.e., Starts[N]) to be equal to the end of the compressed file bitstream 400 (e.g., location C) (block 308).

The example blocks 310-316 of FIG. 3 implement a FOR loop to set the values of the Starts[ ] array, thereby delineating the segments 502-510 of the compressed file bitstream 400 of FIG. 5. Entering the FOR loop, the segment selector 112 sets an index value i equal to 1 (block 310). The segment selector 112 determines whether i is less than N (block 312).

When i is less than N (block 312), the example segment selector 112 sets the value of Starts[i] to be equal to the sum of the location stored at Starts[i−1]+a value S, where S is defined as C/N (block 314). In the example of FIG. 3, S is an equal division of the number of bytes in the compressed file bitstream 400 by the selected number N of segments, where the result of the division is truncated to leave off the remainder. As a result, the final segment N 510 includes any remainder bytes (e.g., between 0 and S−1 additional bytes) and may be larger than the other segments 502-508, which are initially equal in size. The starting locations of the segments 504-510 that are stored in Starts[1] to Starts[N−1] may or may not correspond to the locations of the tokens 402-408 in the compressed file bitstream 400.

The example segment selector 112 increments i by 1 (block 316) and returns to block 312 to test whether i<N. When i is equal to or greater than N (block 312), the example instructions 206 of FIG. 3 end. The instructions 206 may return control to a calling function, such as block 206 of FIG. 2.

Figure 6:
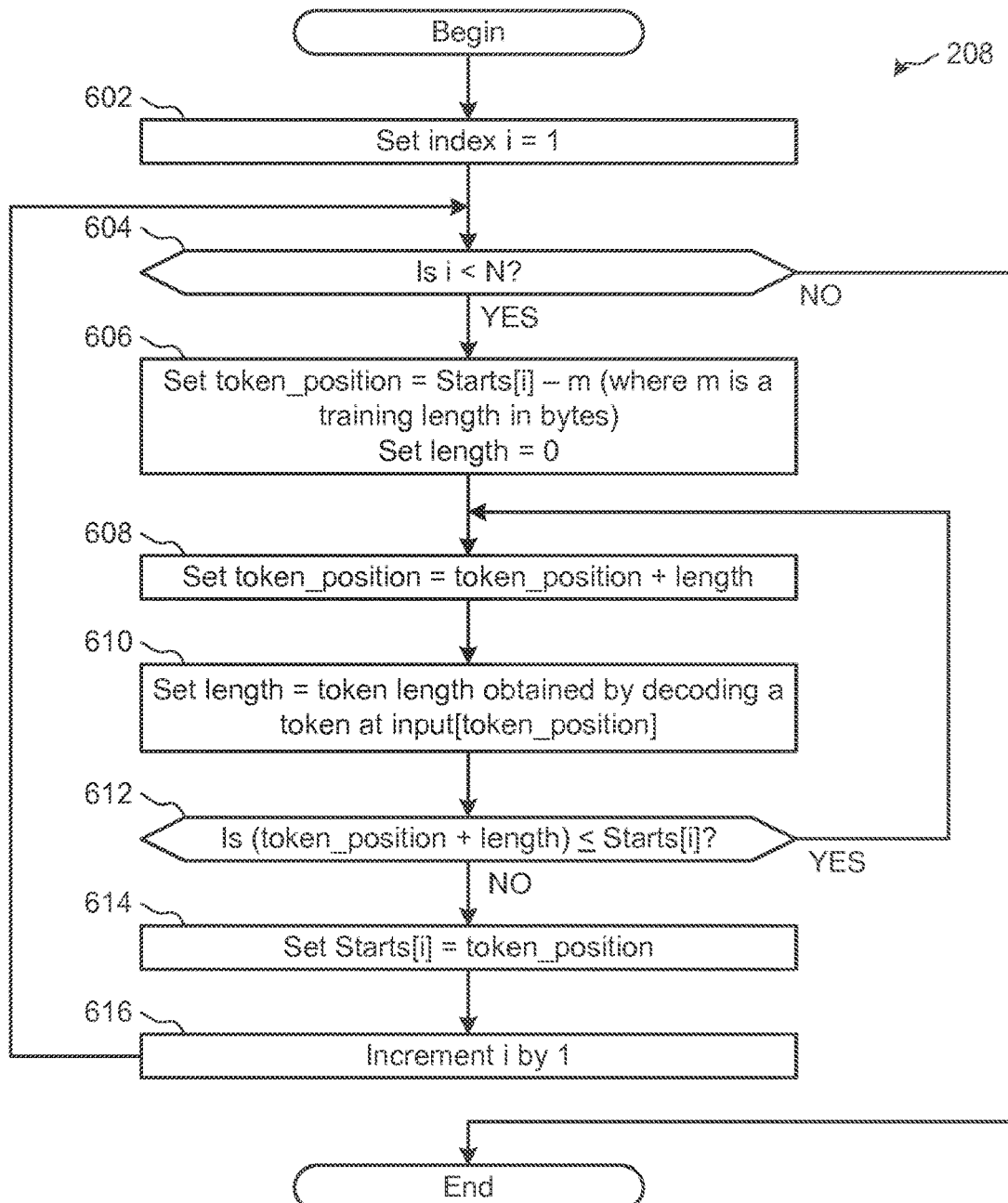
FIG. 6 is a flowchart representative of example computer readable instructions, which may be executed to implement the computing device of FIG. 1, to determine adjusted starting positions for segments to be speculatively decompressed in parallel.
Figure 7:
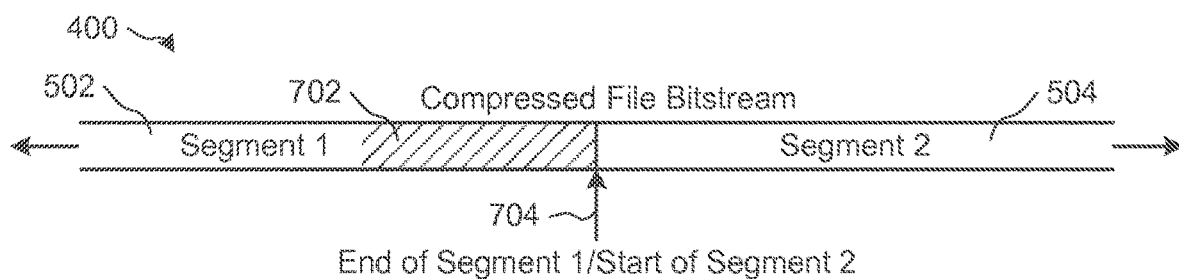
FIG. 7 shows the end of Segment 1 and the beginning of Segment 2 of FIG. 5, and illustrates a training area for Segment 2 within the bitstream assigned to Segment 1.

FIG. 6 is a flowchart representative of example computer readable instructions 208 which may be executed to implement the computing device 100 of FIG. 1 to determine adjusted starting positions for segments to be speculatively decompressed in parallel. FIG. 7 shows the end of Segment 1 502 and the beginning of Segment 2 504 of FIG. 5, and illustrates a training area for Segment 2 within the bitstream assigned to Segment 1. FIGS. 8A-8F illustrate an example training process 800 to determine a starting position or an adjusted starting position for parallel decoding of a segment. The example instructions 208 of FIG. 6 may be executed to implement block 208 of FIG. 2, and are described below with reference to the segments 502, 504 of FIG. 7, the training process 800 of FIGS. 8A-8F, and the computing device 100 of FIG. 1.

The example blocks 602-616 described below implement a FOR loop to adjust the elements of the Starts[ ] array created in the example instructions of FIG. 3. The example segment trainer 114 of FIG. 1 initializes the index i to be equal to 1 (block 602). The segment trainer 114 determines whether the index i is less than the selected number N of segments (block 604).

When the index i is less than N (block 604), the example segment trainer 114 sets a variable token_position to be equal to Starts[i]—a variable m, where m is a training length in bytes, and sets a variable length equal to 0 (block 606). The example training length m may be fixed and/or dynamic based on the number N of segments and/or the sizes of the segments (in bytes).

Figure 8A:
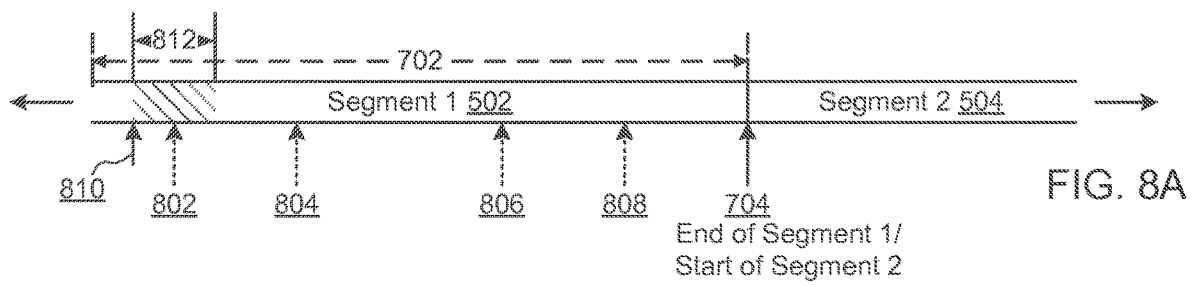
FIGS. 8A-8F illustrate an example training process to determine a starting position or an adjusted starting position for parallel decoding of a segment.

The portion of Segment 1 502 that is between Starts[i]−m and Starts[i] is the training zone 702 for Segment 2 504. The initial value of Starts[i] is an initial start location 704 for Segment 2 504 (e.g., the initial location of the end of Segment 1 502). FIG. 8A shows the example segments 502, 504, the training zone 702, and the initial start location 704. FIG. 8A further shows example locations 802-808 of example valid tokens within the training zone 702 and a location 810 corresponding to the token_position variable. As shown in FIG. 8A, the location 810 is not equal to the start positions of any of the valid tokens 802-808, so the location 810 is an invalid token.

The example segment trainer 114 adds the value of token_position and the value of length, and sets a sum as a new value of the variable token_position (e.g., set token_position=token_position+length) (block 608). The segment trainer 114 then sets the value of length to be a token length obtained by decoding a token located at input [token_position] (block 610). For example, the segment trainer 114 performs an initial layer of decoding by assuming that the data located at input[token_position] is a valid token. Processing the token results in a pointer to a next token (e.g., a number of bytes following input[token_position]), which the segment trainer 114 stores as a new value for the variable length.

In the example of FIG. 8A, the initial value of 0 for length is added to the location 810, resulting in the same location. By decoding the invalid token (shown in crosshatch) located at the location 810, the example segment trainer 114 identifies a length 812 of the invalid token.

The example segment trainer 114 determines whether token_position+length is less than or equal to the value of Starts[i] (block 612). For example, the segment trainer 114 determines whether the pointer from the previously-decoded token points to a location within the training zone 702 or to a location within the segment 504. If token_position+length is less than or equal to the value of Starts[i] (block 612), control returns to block 608 to continue processing tokens within the training zone 702.

By iterating blocks 608-612, the example segment trainer 114 decodes a set of tokens within the training zone 702. The decoding performed by the segment trainer 114 either results in guessing a correct location for at least one of the processed tokens, after which all the tokens processed by the segment trainer 114 within the training zone 702 are valid tokens because valid tokens point to subsequent valid tokens, or b) the segment trainer 114 will have processed a series of incorrect guesses.

Figure 8B:
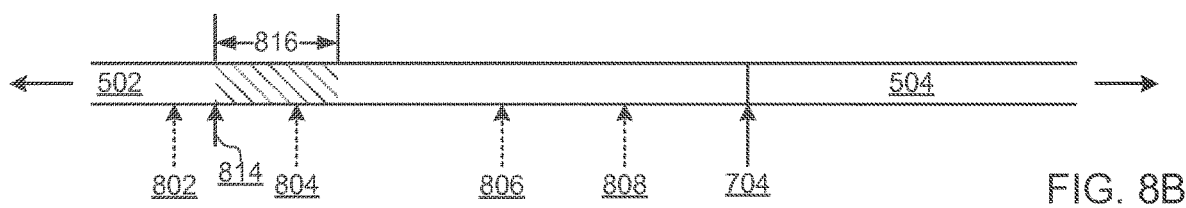

FIG. 8B illustrates a second location 814 for token_position that results from decoding the invalid token at the location 810 that has the length 812 (e.g., adding the length 812 to the location 810 via block 608). Like the location 810, the location 814 does not correspond to any of the valid tokens 802-808. The invalid token located at the location 814 (shown in crosshatch) has a length 816 (e.g., determined by decoding via block 610). The length 816 is determined by decoding the invalid token at the location 814.

Figure 8C:
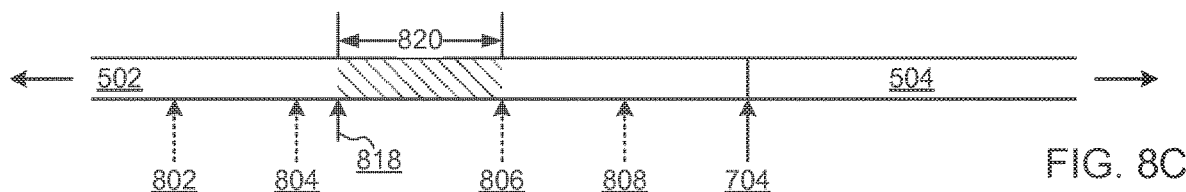

FIG. 8C illustrates a third location 818 for token_position that results from processing the invalid token at the location 814 that has the length 816 (e.g., adding the length 812 to the location 810 via block 608). Like the locations 810, 814, the location 818 does not correspond to any of the valid tokens 802-808. The invalid token located at the location 818 (shown in crosshatch) has a length 820 (e.g., determined by decoding via block 610) and, unlike the prior invalid tokens, points to the location 806 of a valid token (e.g., results in a successful guess of the location of a valid token).

Figure 8D:
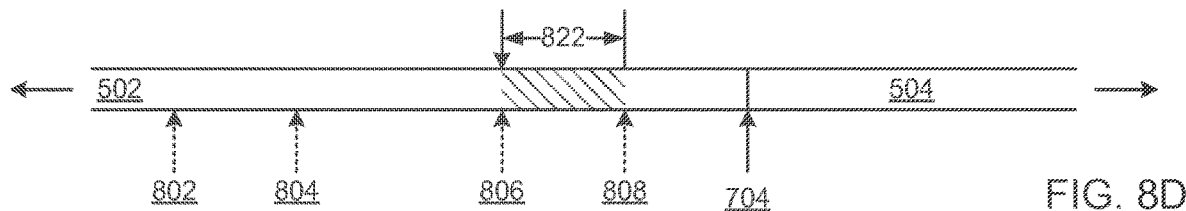

FIG. 8D illustrates the decoding of the valid token located at the location 806, which was selected as the value of token_position based on decoding the invalid symbols as shown in FIGS. 8A-8C. By executing block 610 to determine a length 822 of the valid token at location 806, the example segment trainer 114 identifies the location 808 of the next valid token.

Figure 8E:
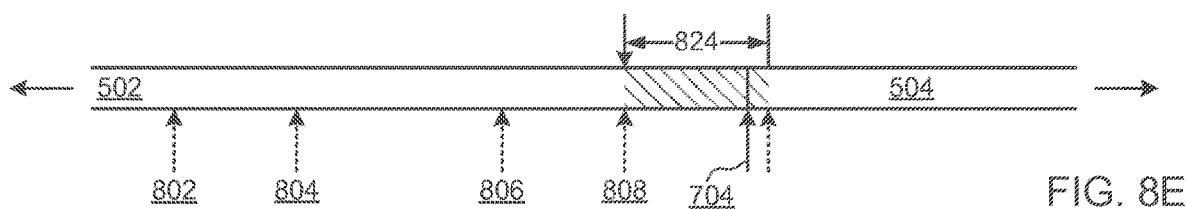

FIG. 8E illustrates the decoding of the valid token located at the location 808, which was selected as the value of token_position (e.g., via block 608) based on decoding the valid symbols as shown in FIG. 8D to obtain the length 822 of the valid symbol at the location 806 (e.g., via block 610).

In the examples of FIGS. 8A-8E, the segment trainer 114 determines that the respective combinations of the locations 810, 814, 818, 806 and the lengths 812, 816, 820, 822 do not exceed the location 704 corresponding to Starts[i] (e.g., the end of Segment 1 502 and the start of Segment 2 504). However, when the segment trainer 114 determines a length 824 of the valid token at location 808 (e.g., via block 610), the segment trainer 114 determines that the sum of the location 808 and the length 824 exceeds the value of the location 704 (e.g., block 612).

Figure 8F:
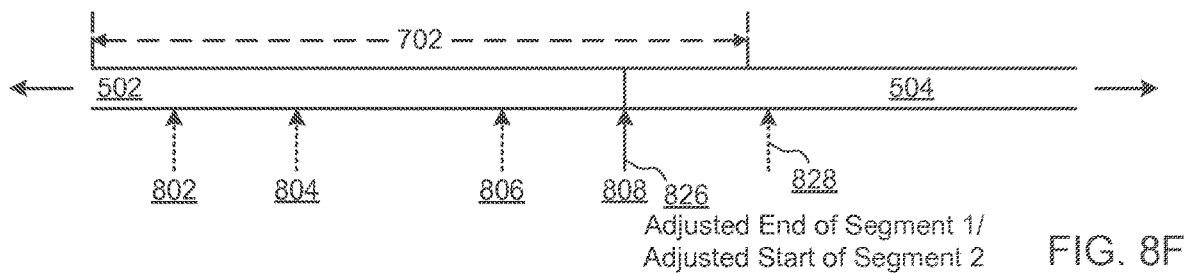

When token_position+length is greater than the value of Starts[i] (block 612), the example segment trainer 114 adjusts the value of Starts[i] to be equal to the value of token_position) block 614). For example, FIG. 8F shows an adjusted location 826 for the end of segment 1 502 and the start of segment 2 504 (e.g., an adjusted value of Starts[i]) being equal to the location 808.

In some other examples, rather than adjusting the value of Starts[i] to be within the training zone 702, the example segment selector 112 adjusts the value of Starts[i] to be equal to token_position+length, which results in a new value of Starts[i] that is either equal to or greater than the initial value of Starts[i]. For example, in FIG. 8F, the adjusted location 826 may be set to be equal to a location 828 of a valid symbol occurring after the symbol at location 808. In either case, the adjusted value of Starts[i] has a higher confidence of being the location of a valid token than the initial value of Starts[i] due to decoding based on the series of guesses within the training zone 702.

The example segment trainer 114 then increments the index i by 1 (block 616) and returns control to block 604 to determine whether i is less than N. When the segment trainer 114 determines that i is greater than or equal to N (block 604), the example instructions 208 end. The example instructions 208 may return control to a calling function, such as block 208 of FIG. 2.

Figure 9A:
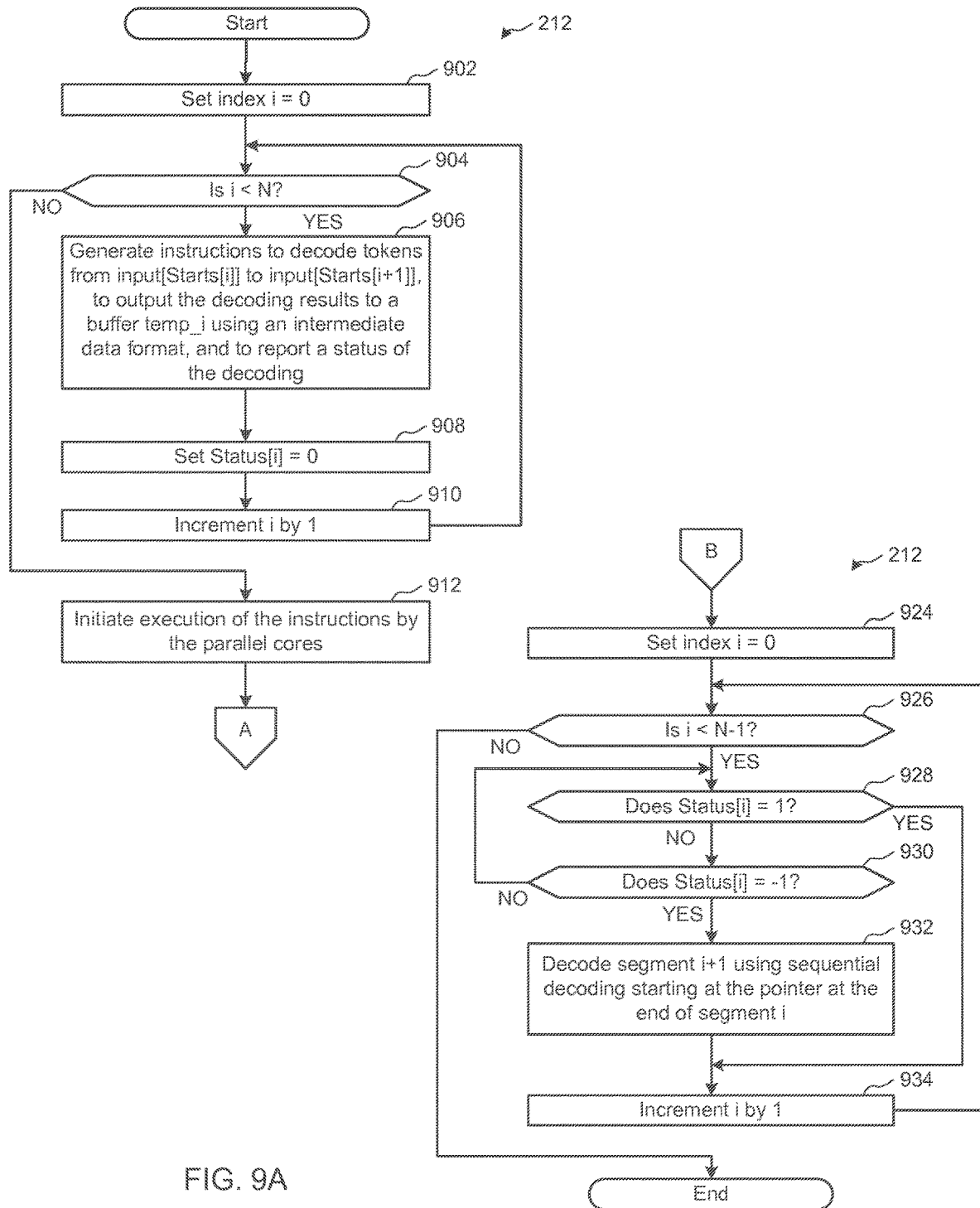
FIGS. 9A-9B show a flowchart representative of example computer readable instructions, which may be executed to implement the computing device of FIG. 1, to decode segments of a compressed data file to an intermediate data format.
Figure 9B:
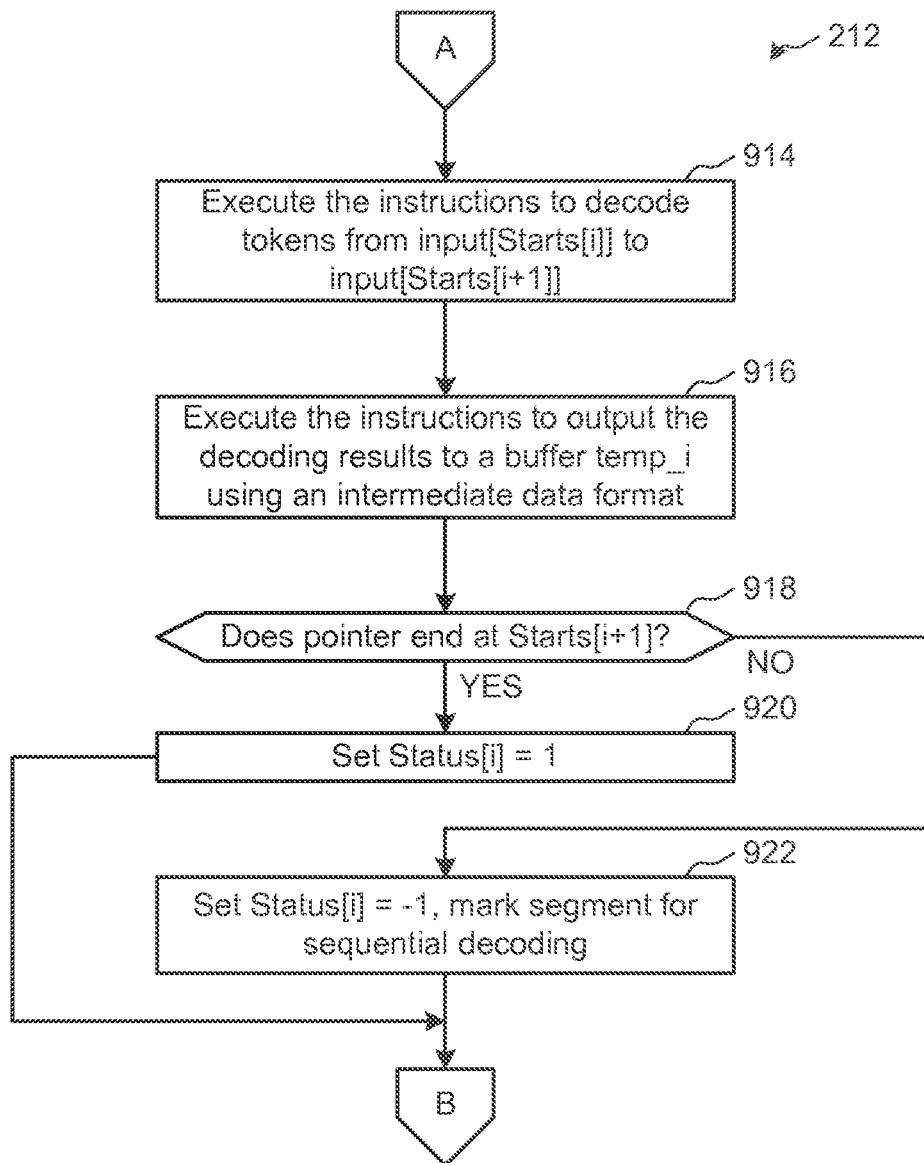

FIGS. 9A-9B show a flowchart representative of example computer readable instructions 212 which may be executed to implement the computing device 100 of FIG. 1 to decode segments of a compressed data file (e.g., the compressed data file 102 of FIG. 1) to an intermediate data format. The example instructions 212 may be executed to implement block 212 of FIG. 2.

Blocks 902-908 implement a FOR loop to generate instructions to decode the segments (e.g., the segments 502-510 of FIG. 5). The example instruction generator 116 of FIG. 1 sets a value of an index variable i to equal 1 (block 902). The instruction generator 116 checks to determine whether the value of i is less than the number N of segments (block 904).

When the value of i is less than the number N of segments (block 904), the example instruction generator 116 generates instructions to decode data in the data array inputs[ ], starting at the location input[Starts[i]] and ending at the location input[Starts[i+1]], and to output the decoding results to a buffer temp_i using an intermediate data format (block 906). For example, the instruction generator 116 may generate instructions to cause the parallel core 106a to implement the Huffman decoder 126a and the intermediate data generator 128a for a first one of the segments. The procedure selected for generating decoding instructions is selected based on the specific technique used to encode the compressed data file 102. In the example of FIGS. 9A-9B, the buffer temp_i refers to a buffer temp_1 for segment 1, a buffer temp_2 for segment 2, and so on for each of the segments.

The example instruction generator 116 sets a value of a status array Status[i] to 0 (block 908). The example status array provides an indication of the status of decoding for each of the N segments by the parallel cores 106a-106n. In the example of FIGS. 9A-9B, a value of 0 for Status[i] indicates that decoding has not completed, a value of 1 for Status[i] indicates that decoding has completed and that the pointer resulting from decoding the final token in segment i points to Starts[i+1] (e.g., the first token speculated for the next segment in the data), and a value of −1 for Status[i] indicates that decoding has completed and that the pointer resulting from decoding the final token in segment i points to a value different than Starts[i+1] (e.g., the next segment likely has a speculation error). The values for the status array discussed above are only examples, and any values may be used.

The example instruction generator 116 then increments the index i by 1 (block 910) and returns control to block 904. By executing block 906 for each of the N segments (e.g., via the FOR loop of blocks 902-908), the example instruction generator 116 generates instructions to decode each of the segments 502-510 in the compressed data file 400 separately and in parallel, thereby decreasing the time required to accomplish the Huffman decoding of the compressed data file 400.

When the instruction generator 116 determines that the index i is equal to or greater than N (block 904), the example instruction generator 116 initiates execution of the instructions by respective ones of the parallel cores 106a-106n (block 912).

Turning to FIG. 9B, the instructions represented by the example blocks 914-922 are performed in parallel by each of the parallel cores 106a-106n that were assigned instructions by the instruction generator 116. For brevity, the example blocks 914-922 are described with reference to the parallel core 106a.

The example Huffman decoder 126a of FIG. 1 executes the instructions provided by the instruction generator 116 to decode tokens in the compressed data file 102 starting at input[Starts[i]] and ending at input[Starts[i+1]] (block 914). Thus, the example Huffman decoder 126a decodes the tokens in the segment i assigned to the parallel core 106a. The procedure for decoding is selected based on the specific technique used to encode the data.

The example intermediate data generator 128a executes the instructions to output the results of decoding (from block 914) to a buffer temp_i using an intermediate data format (block 916). For example, the intermediate data generator 128a may output the decoding results into the LZ4 format, the LZ3 format discussed above, or any other format from which the data can be LZ77 decoded. For segment 2, the example intermediate data generator 128a outputs the intermediate data structures to the buffer temp_2. Any other buffer name may be used.

The example parallel core 106a determines whether the pointer resulting from the decoding ends at Starts[i+1] (block 918). If the pointer resulting from the decoding ends at Starts[i+1] (block 918), the example parallel core 106a sets the Status[i] element equal to 1 (block 920). Setting the Status[i] element equal to 1 indicates that segment i+1 likely correctly locked onto a valid token during the training phase and, thus, the speculative decoding for segment i+1 is likely to be correct. On the other hand, if the pointer resulting from the decoding ends after Starts[i+1] (block 918), the example parallel core 106a sets the Status[i] element to be equal to −1 (block 922). Setting the Status[i] element equal to −1 indicates that segment i+1 likely did not correctly lock onto a valid token during the training phase and, thus, the speculative decoding for segment i+1 is likely to be at least partially incorrect.

After setting the Status[i] element (block 920 or block 922), the example parallel core 106a finishes execution of the generated instructions. In the example of FIGS. 9A-9B, the parallel core 106a provides data to the host core 104 during execution of blocks 914-922 and need not separately return the results of the processing. However, in some other examples, the parallel core 106a holds the results of the processing locally at the parallel core 106a and returns the results (e.g., temp_i, Status[i]) to the host core 104 at the conclusion of executing the instructions.

Returning to FIG. 9A, blocks 924-934 implement a FOR loop to check the decoding for potential errors. The example error checker 120 sets an index value i equal to 0 (block 924). The error checker 120 determines whether the value of i is less than N−1 (block 926).

When the value of i is less than N−1 (block 926), the example error checker 120 determines whether Status[i] is equal to 1 (block 928). If the error checker 120 determines that Status[i] is not equal to 1 (block 928), the error checker 120 determines whether Status[i] is equal to −1 (block 930). If the error checker 120 determines that Status[i] is not equal to −1 (block 930), then Status[i] is equal to 0 (e.g., the parallel core processing segment i has not completed) and control returns to block 928 to continue monitoring Status[i].

When Status[i] is not equal to −1 (block 930), the example error checker 130 of FIG. 1 initiates decoding of the segment i+1 using sequential decoding, starting at the pointer occurring at the end of segment i (block 932). For example, the instruction generator 116 may generate new instructions to decode the segment i+1 from a new starting location.

After decoding the segment i+1 (block 932), or when Status[i] is equal to 1 (block 928), the example error checker 120 increments the index value i by 1 (block 934) and returns control to block 926. When i is equal to or greater than N−1 (block 926), the example instructions 212 of FIGS. 9A-9B end. The example computing device 100 may return control to a calling function, such as block 212 of FIG. 2.

Figure 10A:
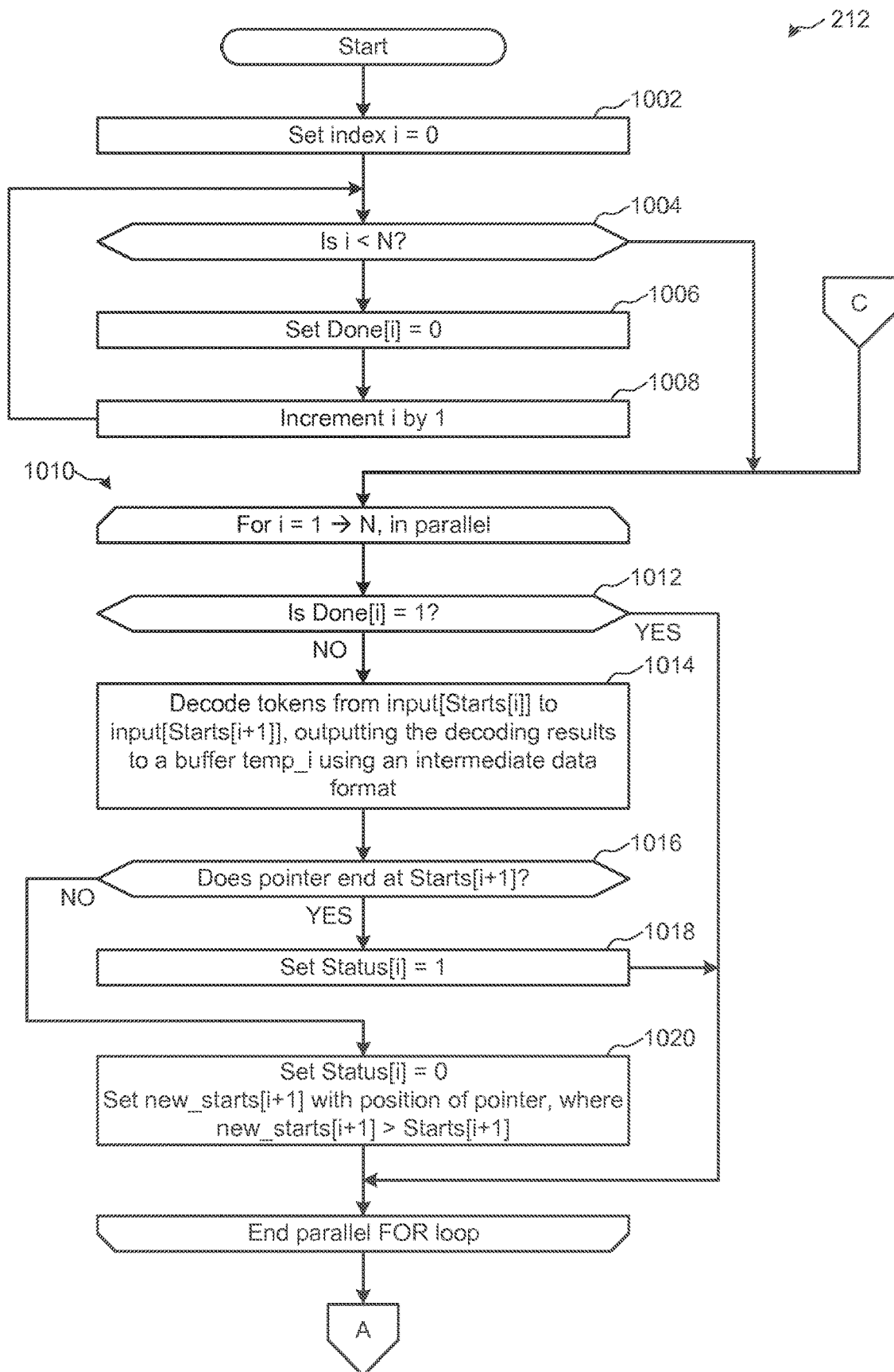
FIGS. 10A-10C show a flowchart representative of example alternative computer readable instructions, which may be executed to implement the computing device of FIG. 1, to decode segments of a compressed data file to an intermediate data format while checking for errors in the decoding.
Figure 10B:
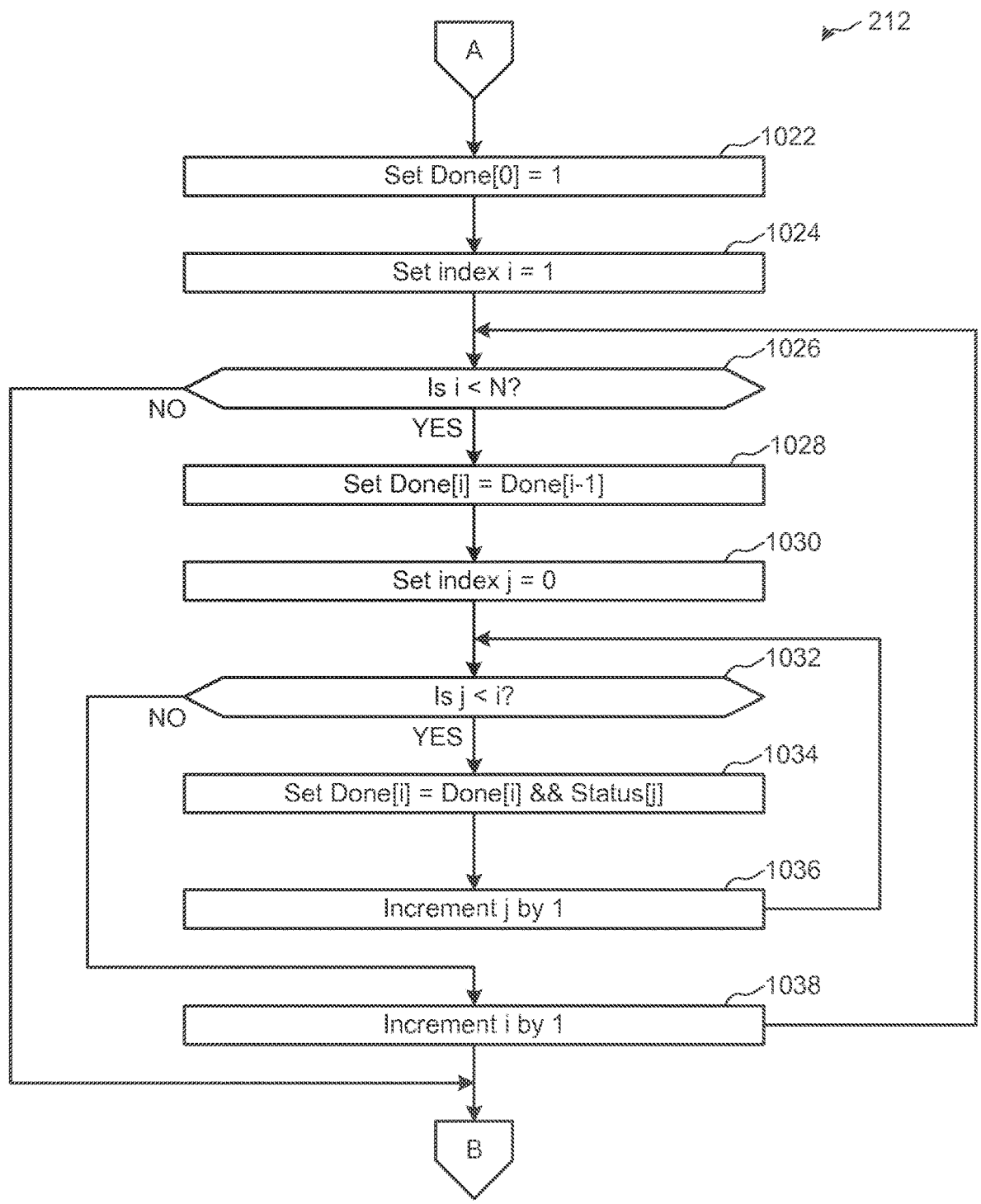
Figure 10C:
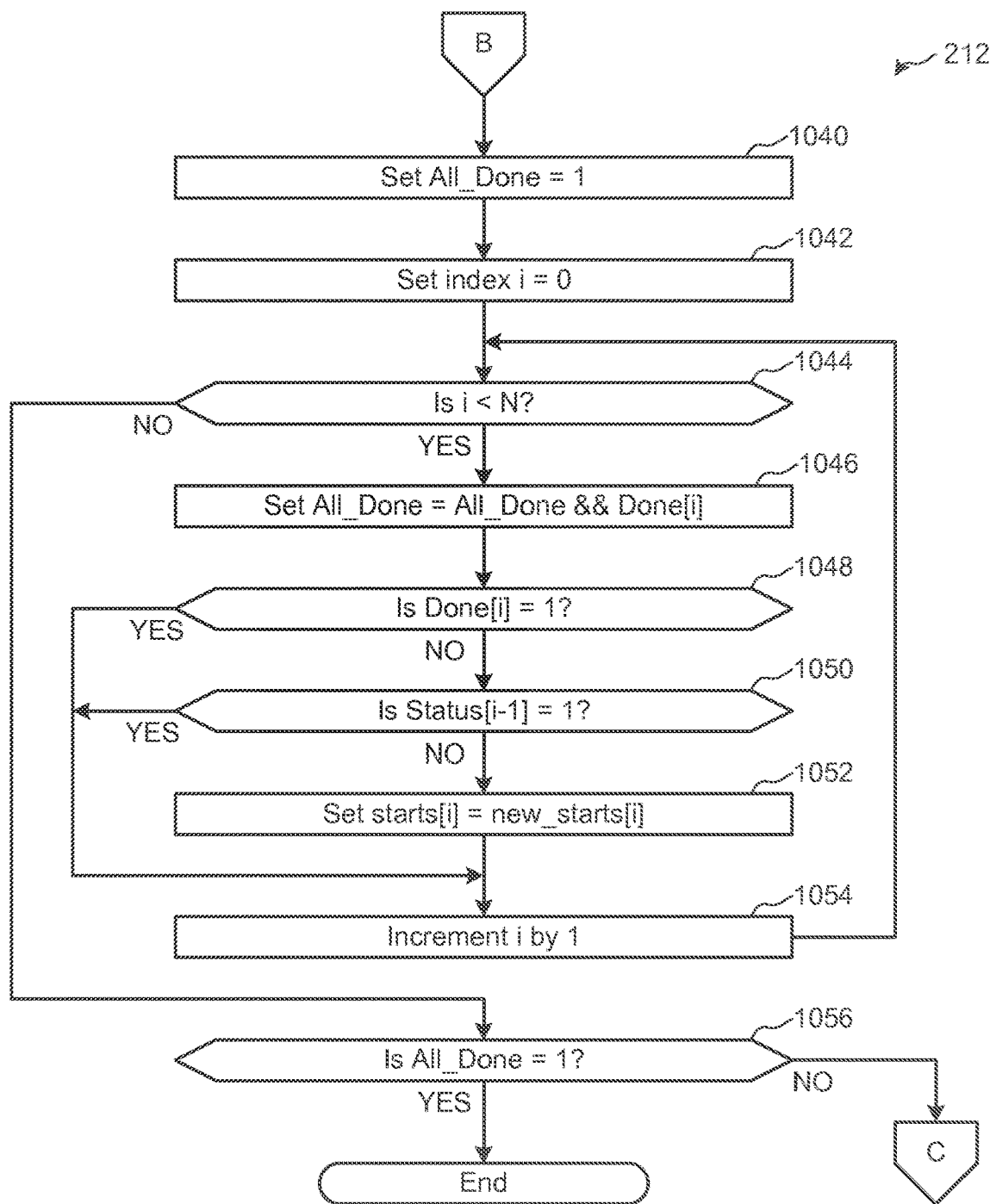

FIGS. 10A-10C show a flowchart representative of example alternative computer readable instructions 212 which may be executed to implement the computing device 100 of FIG. 1 to decode segments of a compressed data file (e.g., the compressed data file 102 of FIG. 1) to an intermediate data format while checking for errors in the decoding. The example instructions 212 may be executed to implement block 212 of FIG. 2.

Blocks 1002-1008 implement a FOR loop to initialize a status array, referred to as Done[ ], having N elements. The example segment merger 118 of FIG. 1 sets an index i equal to 0 (block 1002). The segment merger 118 determines whether the index i is less than the number N of segments (block 1004). If the index i is less than the number N of segments (block 1004), the example segment merger 118 sets the value of Done[i] equal to 0 (block 1006). The example segment merger 118 increments the index i by 1 (block 1008) and returns control to block 1004.

When the index i is equal to or greater than the number N of segments (block 1004), the example instructions 212 enter a parallel FOR loop 1010, in which each of the parallel cores 106a-106n that are assigned a segment in the compressed data file 102 (e.g., N parallel cores 106a-106n) execute the blocks 1012-1020 substantially in parallel. While the example loop 1010 is referred to herein as executing in parallel, the term parallel refers to the ability to execute simultaneously (as opposed to having serial time dependencies), and does not necessarily impose any requirement that the parallel cores 106a-106n start at the same time and/or end at the same time. For brevity, the example loop 1010 will be discussed below with reference to the parallel core 106a. The parallel core 106a is assigned a value for the index i based on, for example, which segment is assigned to the parallel core 106a.

The example parallel core 106a determines whether the value of Done[i] is equal to 1 (block 1012). If the value of Done[i] is not equal to 1 (e.g., if the value of Done[i] is equal to 0) (block 1012), the example Huffman decoder 126a decodes tokens starting from input[Starts[i]] and ending at input[Starts[i+1]] and the intermediate data generator 128a outputs the results of the decoding to a buffer (e.g., a buffer temp_i) using an intermediate data format (block 1014). The procedure for decoding is selected based on the specific technique used to encode the compressed data file 102.

The example Huffman decoder 126a determines whether the pointer occurring at the end of decoding ends at Starts [i+1] (block 1016). The pointer points to a location in inputs[ ] that is after the final decoded token in segment i. If the pointer ends at Starts[i+1] (block 1016), the example parallel core 106a sets the value of Status[i] equal to 1 to indicate that the subsequent segment i+1 is likely to be correctly and validly decoded (block 1018).

On the other hand, if the pointer does not end at Starts [i+1] (block 1016), the example parallel core 106a sets the value of Status[i] equal to 0 to indicate that the subsequent segment i+1 is likely to be at least partially incorrectly decoded (block 1020). The example parallel core 106a also sets a value of an array new_starts[i+1] with the position of the pointer. As a result, new_starts[i+1] is greater than Starts[i+1].

After setting the Status[i] and/or the new_starts[i+1] (block 1018 or block 1020), or if Done[i] is determined to be equal to 1 (block 1012), the example parallel core 106a ends its portion of the parallel FOR loop.

Turning to FIG. 10B, when all of the parallel cores 106a-106n have completed execution (block 1020), the example error checker 120 sets the value of Done[0] equal to 1 (e.g., because the first segment corresponding to Done [0] is decoded without speculation) (block 1022). The example blocks 1024-1038 implement a FOR loop, including a nested FOR loop implemented by blocks 1030-1038, to check whether the parallel cores 106a-106n have identified any speculation errors.

The example error checker 120 sets an index value i equal to 1 (block 1024). The error checker 120 determines whether the value of i is less than the number N of segments (block 1026). When the value of i is less than N (block 1026), the example error checker 120 sets the value of Done[i] to be equal to Done[i−1] (block 1028). As a result, whether a segment is done relies on whether the previous segments are determined to be correctly decoded.

The error checker 120 sets a second index value j equal to 0 (block 1030). The error checker 120 determines whether the value of j is less than the value of the index i (block 1032). The error checker 120 sets the value of Done[i] to be equal to the conjunction of Done[i] and Status[j] (e.g., Done[i] LOGICAL AND Status[j]) (block 1034). As a result, whether segment i is considered complete is based on whether the prior segments have completed decoding.

The error checker 120 increments the index j by 1 (block 1036) and returns control to block 1032. When the value of the index j is equal to or greater than the value of the index i (block 1032), the error checker 120 increments the index i by 1 (block 1038) and returns control to block 1026.

Turning to FIG. 10C, when the value of the index i is equal to or greater than the value of N (block 1026), the example error checker 120 sets a variable All_Done equal to 1 (block 1040). In the example of FIGS. 10A-10C, the example variable All_Done is a Boolean variable.

Blocks 1042-1054 implement a FOR loop to determine whether parallel decoding has correctly completed. The example error checker 120 sets the value of an index i to equal 0 (block 1042). The error checker 120 determines whether the value of i is less than the number N of segments (block 1044).

When the value of the index i is less than N (block 1044), the example error checker sets the value of All_Done to equal the conjunction of the current value of All_Done and Done[i] (e.g., All_Done AND Done[i]) (block 1046). The conjunction of block 1046 performed with each of the values in Done[ ] causes the variable All_Done to equal 0 if any segment i has been determined to be incorrect.

The error checker 120 determines whether the value of Done[i] is equal to 1 (block 1048). If the value of Done[i] is not equal to 1 (e.g., if Done[i] is equal to 0) (block 1048), the error checker 120 determines whether the value of Status[i−1] is equal to 1 (block 1050). If the value of Status[i−1] is not equal to 1 (e.g., the value of Status[i−1] is not equal to 0), the error checker 120 sets the value of Starts[i] to be the value stored in new_starts[i] (block 1052).

If the value of Done[i] is equal to 1 (e.g., the segment i has been correctly decoded) (block 1048), if the value of Status [i−1] is equal to 1 (e.g., the pointer resulting from decoding the prior segment i−1 is not end at the value of Starts[i]) (block 1050), or after setting the new value of Starts[i] (block 1052), the example error checker 120 increments the value of the index i by 1 and returns control to block 1044). By performing blocks 1048, 1050, and 1052, the error checker 120 selectively sets new starting values for re-processing the segments that have not yet been correctly speculatively decoded, and does not cause re-decoding of correctly-decoded segments.

When the value of i is equal to or greater than N (block 1044), the example error checker 120 determines whether the value of All_Done is equal to 1 (block 1056). If all of the segments have been determined to be correctly decoded (e.g., via blocks 1042-1054), All_Done has a value of 1. If any of the segments must be re-decoded using a different starting position in inputs[ ], the value of All_Done is 0. If the error checker 120 determines that All_Done is equal to 0 (block 1056), control returns to the parallel FOR loop 1010 of FIG. 10A to re-decode any segments corresponding to Done[1]=0. When the error checker 120 determines that All_Done is equal to 1 (block 1056), the example instructions 212 end. The example error checker 120 may return control to a calling function, such as block 212 of FIG. 2.

Figure 11:
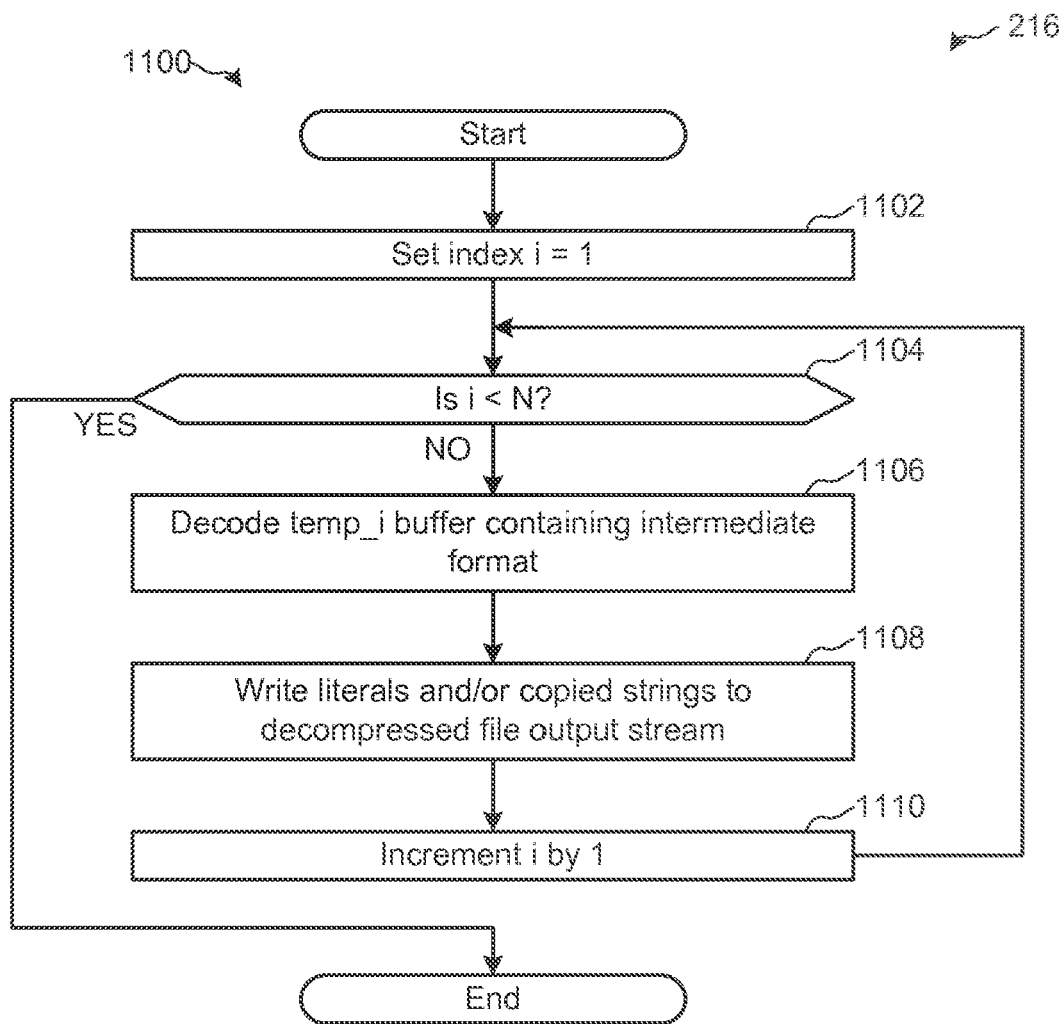
FIG. 11 is a flowchart representative of example computer readable instructions, which may be executed to implement the computing device of FIG. 1, to decode data from an intermediate format to a decompressed data file.

FIG. 11 is a flowchart representative of example computer readable instructions 216 which may be executed to implement the computing device 100 of FIG. 1 to decode data from an intermediate format to a decompressed data file (e.g., the decompressed data file 124 of FIG. 1). The example instructions 216 may be executed to implement block 216 of FIG. 2.

The example blocks 1102-1110 implement a FOR loop to decode data from an intermediate format to a decompressed data file. The example segment merger 118 of FIG. 1 sets an index i equal to 1 (block 1102). The segment merger 118 determines whether the index i is less than the number N of segments (block 1104).

If the index i is less than the number N of segments (block 1104), the example segment merger 118 decodes the temp_i buffer (e.g., the temp_1 buffer for i=1, the temp_2 buffer for i=2, etc.) containing the intermediate format (block 1106). For example, if the intermediate format is the LZ3 or LZ4 format discussed above, the example segment merger 118 determines the strings of literal bytes and/or locates and copies repeated bytes according to the data stored in the intermediate data structures.

The example segment merger 118 writes the identified literals and/or copied strings to a decompressed file output stream (block 1108). For example, when the segment merger 118 identifies literals in the intermediate data structures, the segment merger 118 appends the literal bytes from the literal payload portion of the intermediate data structures to the end of the decompressed data file 124. When the segment merger 118 identifies matched or copied strings in the match portion of the intermediate data structures, the segment merger 118 locates the portions to be copied and appends those portions to the end of the decompressed data file 124.

The example segment merger 118 increments the index i by 1 (block 1110) and passes control to block 1104. When the value of the index i is equal to or greater than N (block 1104), the example instructions 216 end. The example segment merger 118 may return control to a calling function, such as block 216 of FIG. 2.

Figure 12:
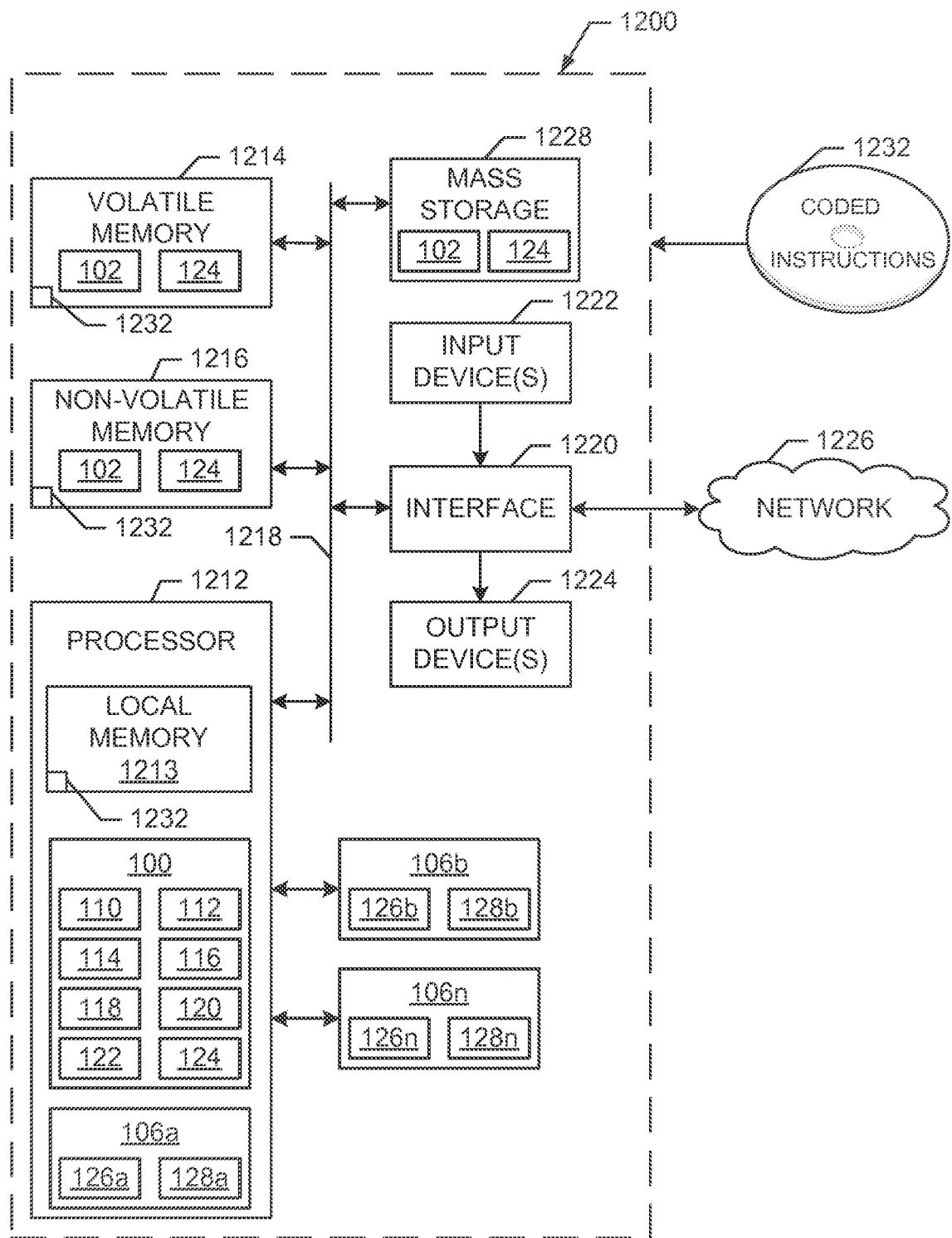
FIG. 12 is a block diagram of an example processor platform capable of executing the instructions of FIGS. 2, 3, 6, 9A-9B, 10A-10C, and/or 11 to implement the computing device of FIG. 1.

FIG. 12 is a block diagram of an example processor platform 1200 capable of executing the instructions of FIGS. 2, 3, 6, 9A-9B, 10A-10C, and/or 11 to implement the computing device 100 of FIG. 1. The processor platform 1200 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors or controllers from any desired family or manufacturer. Additionally, the processor platform 1200 may include any number of processing cores. The example processor 1200 of FIG. 12 may implement the example host core 104, the example parallel cores 106a-106n, the example parallelization selector 110, the example segment selector 112, the example segment trainer 114, the example instruction generator 116, the example segment merger 118, the example error checker 120, the example ratio comparator 122, the example Huffman decoders 126a-126n, the example intermediate data generators 128a-128n and/or, more generally, the example computing device 100 of FIG. 1. Additionally, the example processor 1212 may be in communication with one or more other parallel cores 106b, 106n.

The processor 1212 of the illustrated example includes a local memory 1213 (e.g., a cache). The processor 1212 of the illustrated example is in communication with a main memory including a volatile memory 1214 and a non-volatile memory 1216 via a bus 1218. The volatile memory 1214 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), and/or a PCI express interface.

In the illustrated example, one or more input devices 1222 are connected to the interface circuit 1220. The input device(s) 1222 permit(s) a user to enter data and commands into the processor 1212. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1220 of the illustrated example, thus, typically includes a graphics driver card, a graphics driver chip or a graphics driver processor.

The interface circuit 1220 of the illustrated example also includes a communication device such as a transmitter, a receiver, a transceiver, a modem and/or network interface card to facilitate exchange of data with external machines (e.g., computing devices of any kind) via a network 1226 (e.g., an Ethernet connection, a digital subscriber line (DSL), a telephone line, coaxial cable, a cellular telephone system, etc.).

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, RAID systems, and digital versatile disk (DVD) drives. The example volatile memory 1214, the example non-volatile memory 1216, and/or the example mass storage devices 1228 of FIG. 12 may store all or portions of the compressed data file 102 and/or the decompressed data file 124 of FIG. 1.

The coded instructions 1232 of FIGS. 2, 3, 6, 9A-9B, 10A-10C, and/or 11 may be stored in the mass storage device 1228, in the volatile memory 1214, in the non-volatile memory 1216, and/or on a removable tangible computer readable storage medium such as a CD or DVD.

Example 1 is a method to parallelize data decompression that includes: selecting, by executing an instruction with a processor, initial starting positions in a compressed data bitstream; adjusting, by executing an instruction with the processor, a first one of the initial starting positions to determine a first adjusted starting position by decoding the compressed data bitstream starting at a training position in the compressed data bitstream, the training position preceding the first one of the initial starting positions in the compressed data bitstream, the decoding including traversing the compressed data bitstream from the training position as though first data located at the training position is a valid token; outputting, by executing an instruction with the processor, first decoded data generated by decoding a first segment of the compressed data bitstream starting from the first adjusted starting position; and merging, by executing an instruction with the processor, the first decoded data with second decoded data generated by decoding a second segment of the compressed data bitstream, the decoding of the second segment starting from a second position in the compressed data bitstream and being performed in parallel with the decoding of the first segment, and the second segment preceding the first segment in the compressed data bitstream.

Example 2 includes the subject matter of example 1, further including merging the first decoded data and the second decoded data with additional decoded data generated by decoding other segments of the compressed data bitstream in parallel using parallel processor cores, the first segment, the second segment, and the other segments making up an entirety of the compressed data bitstream.

Example 3 includes the subject matter of example 1, in which the selecting of the initial starting positions, the adjusting of the first one of the initial starting positions, and the merging of the first decoded data with the second decoded data are performed using a host core, and the outputting of the first decoded data is performed by a first one of multiple processor cores decoding the compressed data bitstream in parallel.

Example 4 includes the subject matter of example 1, and further includes determining whether the first decoded data is correctly decoded by determining whether a final token in the second segment points to a first token corresponding to the first adjusted starting position, in which the second segment is located prior to the first segment in the compressed data bitstream.

Example 5 includes the subject matter of example 4, and further includes, in response to determining that the first segment is not correctly decoded, selecting an updated starting position based on a pointer obtained from decoding the final token in the second segment and decoding the compressed data bitstream starting from the updated starting position.

Example 6. includes the subject matter of example 1, and further includes determining whether the first segment is correctly decoded based on whether segments preceding the first segment in the compressed data bitstream have been correctly decoded.

Example 7 includes the subject matter of example 1, and further includes determining a compression format of the compressed data bitstream and selecting a number of segments of the compressed data bitstream to be processed in parallel based on the compression format.

Example 8 includes the subject matter of example 1, and further includes comparing a compression ratio of the compressed data bitstream to a threshold, in which the decoding is based on the compression ratio being less than the threshold.

Example 9 includes the subject matter of example 1, in which the decoding of the first segment includes generating an intermediate data structure, and the merging includes decoding a set of intermediate data structures corresponding to the compressed data bitstream.

Example 10 includes the subject matter of example 9, in which the generating of the intermediate data structure includes storing at least one of literal data, a length of matching data, a first location of matching data, or a second location within the compressed data bitstream of a token that corresponds to the literal data, the length, or the first location of the matching data.

Example 11 includes the subject matter of example 1, and further includes verifying that the first adjusted starting position is a first type of token and is not a second type of token.

Example 12 includes the subject matter of example 1, and further includes outputting third decoded data generated by decoding a third segment from a second one of the initial starting positions that is a token located at a beginning of the compressed data bitstream.

Example 13 is an apparatus to parallelize data decompression that includes: a segment trainer to: select initial starting positions in a compressed data bitstream; and adjust a first one of the initial starting positions to determine a first adjusted starting position by decoding the compressed data bitstream starting at a training position in the compressed data bitstream, the training position preceding the first one of the initial starting positions in the compressed data bitstream, the decoding including traversing the compressed data bitstream from the training position as though first data located at the training position is a valid token; a parallelized decoder to output first decoded data generated by decoding a first segment of the compressed data bitstream starting from the first adjusted starting position; and a segment merger to merge the first decoded data with second decoded data generated by decoding a second segment of the compressed data bitstream, the decoding of the second segment starting from a second position in the compressed data bitstream and being performed in parallel with the decoding of the first segment, and the second segment preceding the first segment in the compressed data bitstream.

Example 14 includes the subject matter of example 13, and further includes a host processing core to implement the segment trainer and the segment merger and a parallelized core to implement the parallelized decoder.

Example 15 includes the subject matter of example 13, in which the parallelized decoder includes a Huffman decoder to decode a Huffman coded token in the compressed data bitstream.

Example 16 includes the subject matter of example 13, and further includes an error checker to determine whether the first segment is correctly decoded based on whether segments preceding the first segment in the compressed data bitstream have been correctly decoded.

Example 17 includes the subject matter of example 13, and further includes an error checker to determine whether the first segment is correctly decoded by determining whether a final token in the second segment points to a first token corresponding to the first adjusted starting position, the second segment being located prior to the first segment in the compressed data bitstream.

Example 18 includes the subject matter of example 13, and further includes an instruction generator to generate instructions which, when executed by the parallelized decoder, cause the parallelized decoder to decode the compressed data bitstream corresponding to the first segment starting at the first adjusted starting position.

Example 19 includes the subject matter of example 13, in which the parallelized decoder includes an intermediate data generator to generate an intermediate data structure based on an output of the parallelized decoder, the segment merger to merge the first segment and the second segment based on the intermediate data structure.

Example 20 includes the subject matter of example 13, and further includes a parallelization selector to select a number of segments based on at least one of a number of cores that are available for parallel processing, an expected compressed file size, or a compression format used to compress the compressed data bitstream.

Example 21 includes the subject matter of example 20, and further includes a ratio comparator to compare a compression ratio of the compressed data bitstream to a threshold, the parallelization selector to select the number of the segments to be more than 1 when the compression ratio is less than the threshold.

Example 22 is a tangible computer readable storage medium comprising computer readable instructions which, when executed, cause a processor to at least: select initial starting positions in a compressed data bitstream; adjust a first one of the initial starting positions to determine a first adjusted starting position by decoding the compressed data bitstream starting at a training position in the compressed data bitstream, the training position preceding the first one of the initial starting positions in the compressed data bitstream, the decoding including traversing the compressed data bitstream from the training position as though first data located at the training position is a valid token; output first decoded data generated by decoding a first segment of the compressed data bitstream starting from the first adjusted starting position; and merge the first decoded data with second decoded data generated by decoding a second segment of the compressed data bitstream, the decoding of the second segment starting from a second position in the compressed data bitstream and being performed in parallel with the decoding of the first segment, and the second segment preceding the first segment in the compressed data bitstream.

Example 23 includes the subject matter of example 22, in which the instructions are to cause the processor to merge the first decoded data and the second decoded data with additional decoded data generated by decoding other segments of the compressed data bitstream in parallel using parallel processor cores, in which the first segment, the second segment, and the other segments make up an entirety of the compressed data bitstream.

Example 24 includes the subject matter of example 22, in which the instructions are further to cause the processor to determine whether the first decoded data is correctly decoded by determining whether a final token in the second segment points to a first token corresponding to the first adjusted starting position, the second segment being located prior to the first segment in the compressed data bitstream.

Example 25 includes the subject matter of example 24, in which the instructions are further to cause the processor to, in response to determining that the first segment is not correctly decoded, select an updated starting position based on a pointer obtained from decoding the final token in the second segment and decode the compressed data bitstream starting from the updated starting position.

Example 26 includes the subject matter of example 22, in which the instructions are further to cause the processor to determine whether the first segment is correctly decoded based on whether preceding the first segment in the compressed data bitstream have been correctly decoded.

Example 27 includes the subject matter of example 22, in which the instructions are further to cause the processor to determine a compression format of the compressed data bitstream and select a number of segments of the compressed data bitstream to be processed in parallel based on the compression format.

Example 28 includes the subject matter of example 22, in which the instructions are further to cause the processor to compare a compression ratio of the compressed data bitstream to a threshold, and the instructions are to cause the processor to decode when on the compression ratio is less than the threshold.

Example 29 includes the subject matter of example 22, in which the instructions are to cause the processor to decode the first segment includes generating an intermediate data structure, and the instructions are to cause the processor to merge the first decoded data with the second decoded data by decoding a set of intermediate data structures corresponding to the compressed data bitstream.

Example 30 includes the subject matter of example 29, in which the instructions are to cause the processor to generate the intermediate data structure by storing at least one of literal data, a length of matching data, a first location of matching data, or a second location within the compressed data bitstream of a token that corresponds to the literal data, the length, or the location of the matching data.

Example 31 includes the subject matter of example 22, in which the instructions are further to cause the processor to verify that the first adjusted starting position is a first type of token and is not a second type of token.

Example 32 includes the subject matter of example 22, in which the instructions are further to cause the processor to output third decoded data generated by decoding a third segment from a second one of the initial starting positions that is a token located at a beginning of the compressed data bitstream.

Example 33 is a method to parallelize data decompression, comprising: selecting, by executing an instruction with a processor, initial starting positions in a compressed data bitstream; adjusting, by executing an instruction with the processor, one or more of the initial starting positions to determine one or more adjusted starting positions by decoding the compressed data bitstream starting at corresponding training positions in the compressed data bitstream, the training positions preceding respective ones of the initial starting positions in the compressed data bitstream, the decoding of the compressed data bitstream including traversing the compressed data bitstream from the training position as though data located at the training positions are valid tokens; assigning segments of the compressed data bitstream to parallelized processing cores, the segments corresponding to the one or more of the initial starting positions or the one or more adjusted starting positions; outputting, by executing an instruction with the processor, first decoded data generated by decoding one of the segments of the compressed data bitstream starting from a corresponding one of the adjusted starting positions; and merging, by executing an instruction with the processor, the first decoded data with second decoded data generated by decoding the other ones of the segments.

Example 34 includes the subject matter of example 33, and further includes determining whether the first segment is correctly decoded based on whether the other ones of the segments that precede the first segment in the compressed data bitstream have been correctly decoded.

Example 35 is an apparatus to parallelize data decompression, comprising: means for selecting initial starting positions in a compressed data bitstream; means for adjusting a first one of the initial starting positions to determine a first adjusted starting position by decoding the compressed data bitstream starting at a training position in the compressed data bitstream, the training position preceding the first one of the initial starting positions in the compressed data bitstream, the decoding including traversing the compressed data bitstream from the training position as though first data located at the training position is a valid token; means for outputting first decoded data generated by decoding a first segment of the compressed data bitstream starting from the first adjusted starting position; and means for merging the first decoded data with second decoded data generated by decoding a second segment of the compressed data bitstream, the decoding of the second segment starting from a second position in the compressed data bitstream and being performed in parallel with the decoding of the first segment, and the second segment preceding the first segment in the compressed data bitstream.

Example 36 includes the subject matter of example 35, in which the means for outputting the first decoded data includes means for decoding a Huffman coded token in the compressed data bitstream and, optionally, includes means for generating an intermediate data structure based on an output of the parallelized decoder, the segment merger to merge the first segment and the second segment based on the intermediate data structure and, optionally, includes means for generating instructions which, when executed by the means for outputting the first decoded data, cause the means for outputting the first decoded data to decode the compressed data bitstream corresponding to the first segment starting at the first adjusted starting position.

Example 37 includes the subject matter of example 35, and further includes means for determining whether the first segment is correctly decoded based on at least one of: whether segments preceding the first segment in the compressed data bitstream have been correctly decoded; or whether a final token in the second segment points to a first token corresponding to the first adjusted starting position, the second segment being located prior to the first segment in the compressed data bitstream.

Example 38 includes the subject matter of example 35, and further includes means for selecting a number of segments based on at least one of a number of cores that are available for parallel processing, an expected compressed file size, or a compression format used to compress the compressed data bitstream and, optionally, further includes means for comparing a compression ratio of the compressed data bitstream to a threshold, the parallelization selector to select the number of the segments to be more than 1 when the compression ratio is less than the threshold.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to parallelize data decompression, the apparatus comprising:
   memory; and
   processor circuitry to execute machine readable instructions to at least:
   divide a compressed file into a quantity of segments;
   identify a starting location for respective ones of the quantity of segments;
   assign separate processing unit circuits to the respective ones of the quantity of segments;
   for respective ones of the separate processing unit circuits:
   select a speculative token location for a respective one of the quantity of segments;
   speculatively decode a first candidate token at the speculative token location;
   when the first candidate token is invalid, update the speculative token location based on a first token length value from the invalid first candidate token;
   speculatively decode a second candidate token at the updated speculative token location; and
   when the second candidate token is valid, extract a plurality of valid token locations corresponding to the respective segment.

2. The apparatus as defined in claim 1, wherein the separate processing unit circuits include at least one of a processor or a processor core.

3. The apparatus as defined in claim 1, wherein the respective one of the separate processing unit circuits is to identify a subsequent valid token location based on length information corresponding to the second candidate token.

4. The apparatus as defined in claim 1, wherein the quantity of segments is based on a quantity of available separate processing unit circuits.

5. The apparatus as defined in claim 1, wherein respective ones of the quantity of segments include a same length.

6. The apparatus as defined in claim 1, wherein respective ones of the quantity of segments is non-overlapping.

7. The apparatus as defined in claim 1, wherein respective ones of the separate processing unit circuitry are to merge decoded data corresponding to the second candidate token, the decoded data corresponding to the compressed file.

8. An apparatus to parallelize data decompression, the apparatus comprising:
   segment training circuitry to:
   divide a compressed file into a quantity of segments; and
   identify a starting location for respective ones of the quantity of segments;
   parallelization circuitry to assign separate processing unit circuits to the respective ones of the quantity of segments;
   for respective ones of the separate processing unit circuits;
   the segment training circuitry to select a speculative token location for a respective one of the quantity of segments;
   decoding circuitry to:
   speculatively decode a first candidate token at the speculative token location;
   when the first candidate token is invalid, the segment training circuitry to update the speculative token location based on a first token length value from the invalid first candidate token, and the decoding circuitry to speculatively decode a second candidate token at the updated speculative token location; and when the second candidate token is valid, extract a plurality of valid token locations corresponding to the respective segment.

9. The apparatus as defined in claim 8, wherein the separate processing unit circuits include at least one of a processor or a processor core.

10. The apparatus as defined in claim 8, wherein the respective one of the separate processing unit circuits is to identify a subsequent valid token location based on length information corresponding to the second candidate token.

11. The apparatus as defined in claim 8, wherein the quantity of segments is based on a quantity of available separate processing unit circuits.

12. The apparatus as defined in claim 8, wherein respective ones of the quantity of segments include a same length.

13. The apparatus as defined in claim 8, wherein respective ones of the quantity of segments is non-overlapping.

14. The apparatus as defined in claim 8, further including segment merging circuitry to merge decoded data corresponding to the second candidate token for respective ones of the separate processing unit circuitry, the decoded data corresponding to the compressed file.

15. A non-transitory computer readable storage medium comprising instructions that, when executed by at least one processing circuit, cause the at least one processing circuit to at least:
divide a compressed file into a quantity of segments;
identify a starting location for respective ones of the quantity of segments;
assign separate ones of the at least one processing circuit to the respective ones of the quantity of segments;
for the separate ones of the at least one processing circuit:
select a speculative token location for a respective one of the quantity of segments;
speculatively decode a first candidate token at the speculative token location;
when the first candidate token is invalid, update the speculative token location based on a first token length value from the invalid first candidate token;
speculatively decode a second candidate token at the updated speculative token location; and
when the second candidate token is valid, extract a plurality of valid token locations corresponding to the respective segment.

16. The non-transitory computer readable storage medium as defined in claim 15, wherein the separate ones of the at least one processing circuit includes at least one of a processor core or a processor.

17. The non-transitory computer readable storage medium as defined in claim 15, wherein the separate ones of the at least one processing circuit are to identify a subsequent valid token location based on length information corresponding to the second candidate token.

18. The non-transitory computer readable storage medium as defined in claim 15, wherein the quantity of segments is based on a quantity of available separate processing unit circuits.

19. The non-transitory computer readable storage medium as defined in claim 15, wherein respective ones of the quantity of segments include a same length.

20. The non-transitory computer readable storage medium as defined in claim 15, wherein respective ones of the quantity of segments is non-overlapping.

* * * * *